United States Patent [19]
Sumi et al.

[11] Patent Number: 5,767,528
[45] Date of Patent: Jun. 16, 1998

[54] SEMICONDUCTOR DEVICE INCLUDING PAD PORTION FOR TESTING

[75] Inventors: Yukinori Sumi; Norio Fukasawa, both of Kawasaki, Japan

[73] Assignee: Fujitsu Limited, Kanagawa, Japan

[21] Appl. No.: 691,608

[22] Filed: Aug. 2, 1996

[30] Foreign Application Priority Data

Feb. 20, 1996 [JP] Japan .................... 8-032291

[51] Int. Cl.[6] .................... H01L 23/58
[52] U.S. Cl. .................... 257/48; 257/690; 257/738; 257/778
[58] Field of Search ............ 257/738, 48, 778, 257/690

[56] References Cited

U.S. PATENT DOCUMENTS

| | | | |
|---|---|---|---|
| 5,250,841 | 10/1993 | Sloan et al. | 257/48 |
| 5,334,857 | 8/1994 | Mennitt et al. | 257/48 |
| 5,334,858 | 8/1994 | Wada | 257/48 |
| 5,394,009 | 2/1995 | Loo | 257/778 |
| 5,409,865 | 4/1995 | Karnezos | 257/738 |
| 5,619,070 | 4/1997 | Kozono | 257/778 |

*Primary Examiner*—Tom Thomas
*Assistant Examiner*—Roy Potter
*Attorney, Agent, or Firm*—Armstrong, Westerman, Hattori, McLeland & Naughton

[57] ABSTRACT

A semiconductor device includes a semiconductor element; a wiring board including a base film on which a plurality of leads are provided; projecting electrodes, provided in an array, projecting from a lower surface of the wiring board; a plurality of leads, each of which has an inner lead portion connected to the semiconductor element and an outer lead portion connected to the projecting electrodes; a mounting hole provided in the base film for mounting the semiconductor element; and a supporting member supporting the wiring board and having a cavity for accommodating the semiconductor element in a position corresponding to the mounting hole. A pad portion for measurement is provided at a position spaced from the outer lead portion.

21 Claims, 37 Drawing Sheets

SEMICONDUCTOR DEVICE INCLUDING PAD PORTION FOR TESTING

BACKGROUND OF THE INVENTION

1. Field of the Invention

The present invention generally relates to semiconductor devices, and particularly, to a semiconductor device of a ball grid array (hereinafter referred to as BGA) type. More specifically, the present invention relates to a semiconductor device having a configuration in which projected electrodes are formed on a wiring board.

Recently, semiconductor devices have been highly integrated and there are demands for down-sized and low-cost semiconductor devices. In response to such a demand, packaged type semiconductor devices called BGA type semiconductor devices have attracted attention, in which, compared to QFP type semiconductor devices, terminals for an outer connection are provided on one surface of the device in an array with wider pitch. Further, occurrence of deformation of the terminal is low. Among those BGA type semiconductor device, a T-BGA (tape-BGA) type semiconductor device has an advantage. Since a tape-shape board is employed as a wiring board, down-sizing of the device is relatively easy.

Meanwhile, high reliability is required for a semiconductor device and a test for examining a proper functioning of the device must be carried out in order to check such high reliability.

In the QFP type semiconductor device, since the terminals for an outer connection are provided around the device, it is easy to check the electrical connection, even after mounting the device on a mother board, between the terminals for an outer connection and the terminals of the mother board and correct a problem if it exists.

In the BGA type device, however, since ball-type terminals are provided in an array on one surface, it is difficult to visually check the electrical connection once it is mounted on the mother board and, even if the check can be made, it is extremely difficult to correct a problem.

Therefore, there is a demand for BGA type semiconductor devices on which a reliability test can easily be carried out even after the device is mounted on the mother board.

2. Description of the Related Art

FIGS. 1 and 2 are diagrams for explaining a conventional T-BGA type semiconductor device. FIG. 1 shows an exploded view of a conventional T-BGA type semiconductor device and FIG. 2 is a cross-sectional view of a conventional T-BGA type semiconductor device. The semiconductor device shown in the figures is comprised of a semiconductor element 2, a wiring board 3, supporting member 4, bump electrodes 5 and so on.

The semiconductor element 2 is a so-called bare chip and other bump electrodes 8 are formed underneath thereof. The semiconductor element 2 is connected to the wiring board 3 by flip chip bonding.

The wiring board 3 is comprised of base film 6, leads 7, insulating membrane and so on. The base film 6 is an insulated film having a flexible property and the leads 7 are made of a conductive metal and have a predetermined pattern formed in the base film 6.

The leads 7 are comprised of an inner lead portion 7a to which the above-mentioned semiconductor element 2 is connected and an outer lead portion 7b which is connected to the bump electrodes 5. Also, the insulating membrane covers the lead 7 except for portions which are connected to the bump electrodes 5.

The supporting member 4 has a substantially similar shape to the wiring board 3 and a hole which forms a cavity 4a is made in the central portion. The supporting member 4 has a function of supporting the wiring board 3 and is made of, for example, metallic material. The wiring board 3 is combined with the supporting member 4 by an adhesive.

The inner lead portion 7a of the lead 7 is arranged so that it extends inside of the cavity 4a when the wiring board 3 is combined with the supporting member 4. As mentioned above, the semiconductor element 2 is flip-chip bonded to the inner lead portion 7a extending inside of the cavity 4a. Thus, the semiconductor element 2 is positioned in the cavity 4a.

The outer lead portion 7b of the lead 7 is arranged so that it is positioned at the other side of the supporting member 4 and, as mentioned above, the bump electrodes 5 are connected to the outer lead portion 7b. The bump electrodes 5 can be solder bumps made of solder balls and, as mentioned above, each of them are provided in a predetermined position of the outer lead portion 7b where it is not covered by the insulating membrane. Thus, the semiconductor element 2 is electrically connected to the bump electrodes 5 through the lead 7.

Moreover, sealing resin 9 is filled in the cavity 4a where the semiconductor element 2 is located, as shown in FIG. 2, so that the inner lead portion 7a of the lead 7 as well as the semiconductor element 2 is sealed by the resin.

However, as mentioned above, there is a problem for the T-BGA type semiconductor device that, although its size can be reduced easily, a reliability test which examines electrical connections of the device is not easy to be performed since a plurality of bump electrodes are provided, in a mass or array form, on the other side of the supporting member 4.

That is, an electrical connection and operation test is usually performed by connecting the bump electrodes 5 to a tester, sending test signals to the semiconductor element 2 and judging if the semiconductor device 1 is operating normally. Thus, a proper test cannot be carried out if the electrical connection between the bump electrodes 5 and the tester is not sufficient.

A probe (testing needle) is usually used as connection means for connecting the tester and the bump electrodes 5 and, therefore, there is a danger that some of the electrodes 5 are damaged or pushed down when contacted with the probe. Once the electrodes 5 are damaged or pushed down, there is no guarantee for a correct function of the semiconductor device 2.

Moreover, the above-mentioned test can only be carried out before the semiconductor device 1 is mounted on a mounting board for the BGA (including T-BGA) type semiconductor device since the probe cannot reach the electrodes 5 once the device 1 is mounted.

SUMMARY OF THE INVENTION

It is a general object of this invention to provide a semiconductor device in which the above-mentioned problems are eliminated.

A more specific object of the present invention is to provide a semiconductor device in which a reliability of electrical connections is improved.

Another object of the present invention is to provide a semiconductor device on which a reliability test examining an electrical connection of the device can easily be performed even after mounting the device on a mounting board.

Another object of the present invention is to provide a semiconductor device in which there is no danger of damage to electrodes by a probe during a reliability test.

The objects described above are achieved by a semiconductor device comprising: a semiconductor element; a wiring board including a base film on which a plurality of leads are provided; projecting electrodes, provided in an array, projecting from a lower surface of said wiring board; a plurality of leads, each of which has an inner lead portion connected to said semiconductor element and an outer lead portion connected to said projecting electrodes; a mounting hole provided in said base film for mounting said semiconductor element; and a supporting member supporting said wiring board and having a cavity for accommodating said semiconductor element in a position corresponding to said mounting hole, wherein a pad portion for measurement is provided.

The objects described above are achieved by a semiconductor device comprising: a semiconductor element; a wiring board including a base film on which a plurality of leads are provided; projecting electrodes, provided in an array, projecting from a lower surface of the wiring board; a plurality of leads, each of which has an inner lead portion connected to the semiconductor element and an outer lead portion connected to the projecting electrodes; a mounting hole provided in the base film for mounting the semiconductor element; and a supporting member supporting the wiring board and having a cavity for accommodating the semiconductor element in a position corresponding to the mounting hole, wherein a pad portion for measurement is provided at a position spaced from said outer lead portion.

According to the above semiconductor device, a reliability test or electrical connection test can easily be performed using the pad portion for measurement even after mounting the semiconductor device on a mother board.

The objects described above are also achieved by a semiconductor device comprising: a semiconductor element; a wiring board including a base film on which a plurality of leads are provided; projecting electrodes, provided in an array, projecting from a lower surface of the wiring board; a plurality of leads, each of which has an inner lead portion connected to the semiconductor element and an outer lead portion connected to the projecting electrodes; a mounting hole provided in the base film for mounting the semiconductor element; and a supporting member supporting the wiring board and having a cavity for accommodating the semiconductor element in a position corresponding to the mounting hole, wherein the wiring board being bent along the supporting member and a pad portion for measurement provided on either an upper, side or lower surface of the supporting member.

According to the above semiconductor devices, a reliability test or electrical connection test can be easily performed using the pad portion for measurement, the pad being provided on an upper surface, side surface or lower surface of the supporting member, even after mounting the semiconductor device on a mother board.

The objects described above are also achieved by the semiconductor device wherein a guiding concave portion for guiding a bending position of the wiring board is provided with the supporting member.

According to the above semiconductor device, a bending position of the wiring board can be easily determined.

The objects described above are also achieved by the semiconductor device further provided with a heat-dissipating plate thermally connected to the semiconductor element.

According to the above semiconductor device, the heat generated by the semiconductor element can be released effectively through the heat-dissipating plate.

The objects described above are also achieved by the semiconductor device wherein the supporting member is a thermally conductive material and is thermally connected to the semiconductor element.

According to the above semiconductor device, since the supporting member is used as a heat-dissipating plate, the heat generated by the semiconductor device can be effectively released without increasing the number of parts necessary for such function.

The objects described above are also achieved by the semiconductor device wherein the semiconductor element is sealed air-tight in the cavity.

According to the above semiconductor device, since the semiconductor element may be securely sealed for maintaining an excellent heat-releasing ability, the reliability of the semiconductor device can be improved.

The objects described above are also achieved by the semiconductor device wherein the semiconductor element is sealed in the cavity by a resin.

According to the above semiconductor device, the semiconductor element can be sealed in the cavity at a low cost and with mass-production.

The objects described above are also achieved by the semiconductor device further comprising a vent portion extending in at least one direction to connect the cavity externally is formed in the supporting member so as to enable sealing of the semiconductor element by resin.

According to the above semiconductor device, a mold resin can be smoothly introduced to the cavity.

The objects described above are also achieved by the semiconductor device wherein the semiconductor element is sealed in the cavity by a resin using the heat-dissipating plate as a part of a mold.

According to the above semiconductor device, the structure of a mold used for molding a resin may be simplified.

The objects described above are also achieved by the semiconductor device wherein a holding member supporting the semiconductor element is provided in the wiring board.

According to the above semiconductor device, since the semiconductor element can be firmly supported by the holding member, it is possible to prevent detachment of the semiconductor element from the wiring board during, for example, a sealing process using a resin.

The objects described above are also achieved by the semiconductor device further provided with an elastic member located between the holding member and the semiconductor element.

According to the above semiconductor device, if an external shock is given to the semiconductor device, the shock can be absorbed by the elastic member and problems such as detachment of the semiconductor device from the lead can be prevented. Thus, the reliability of the electrical connection between the semiconductor element and the lead can be increased.

The objects described above are also achieved by the semiconductor device further comprising a plurality of pad-for-measurement forming regions are formed in the wiring board and each of the pad-for-measurement forming regions has at least one inclining side.

According to the above semiconductor device, the space between each of the pad portions can be widened and this makes it easy to contact the testing probe with a targeting portion during the reliability test.

The objects described above are also achieved by the semiconductor device wherein the wiring board is comprised of: a main body to which the semiconductor element and the projecting electrodes are provided; a plurality of pad-for-measurement forming regions in which the pad portions for measurement are formed; and a connecting member electrically connecting the main body with the pad-for-measurement forming regions.

According to the above semiconductor device, since it is possible to produce the main body and the pad-for-measurement forming regions separately, large size construction materials are no longer necessary and production cost of the semiconductor device can be reduced.

The objects described above are also achieved by the semiconductor device wherein the supporting member is divided into a plurality of supporting member portions and the plurality of supporting member portions are combined by an elastic member provided between the supporting member portions.

According to the above semiconductor device, thermal expansion of the supporting member portions caused during a heating process can be absorbed by the elastic member and, therefore, a generation of stress at connecting portions of the semiconductor element and the leads or that of the projecting electrodes and the leads may be prevented.

The objects described above are also achieved by the semiconductor device wherein the shape of the projecting electrodes can be any one of ball-shape, pillar shape, needle shape and flat shape.

According to the above semiconductor device, since each of these terminals can easily be produced using known methods, the production cost will be inexpensive. Also, since the shape of the electrodes can appropriately be chosen according to a terminal structure of the mounting board, application of the present invention can be increased.

Other objects and further features of the present invention will be apparent from the following detailed description when read in conjunction with the accompanied drawings.

DESCRIPTION OF THE PREFERRED EMBODIMENTS

A description will be given of embodiments of a semiconductor device according to the present invention with reference to the accompanying drawings. Note that although a T-BGA type semiconductor device is used in the following embodiments, the present invention is not limited to those T-BGA type semiconductor devices and can be applied to other BGA type semiconductor devices.

Figure 3:
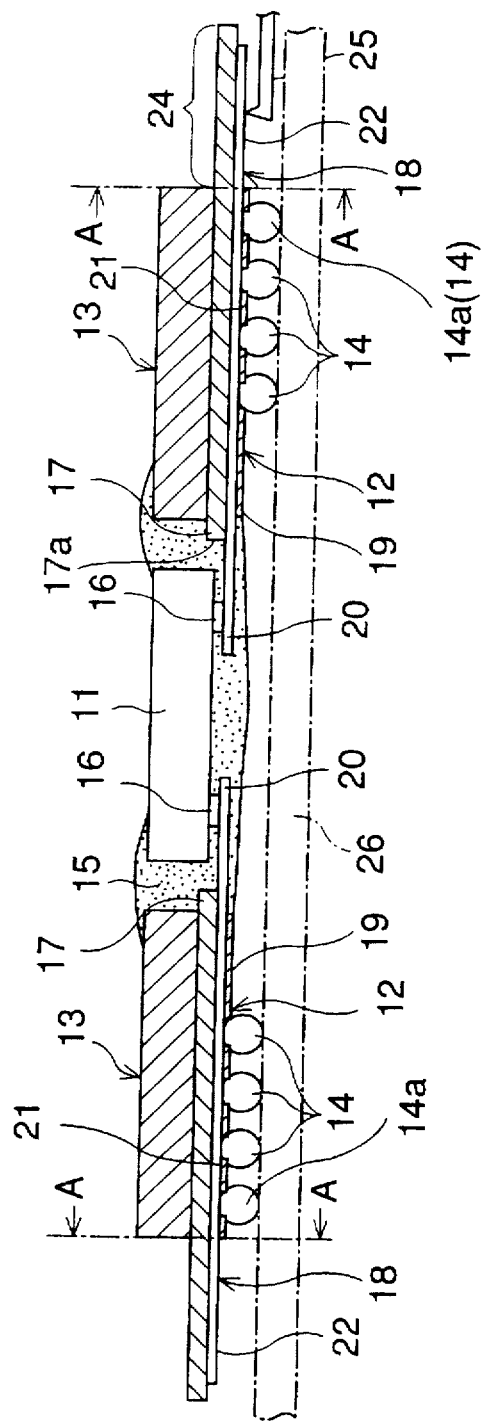
FIG. 3 is a cross-sectional view of a semiconductor device according to the first embodiment of the present invention.
Figure 4:
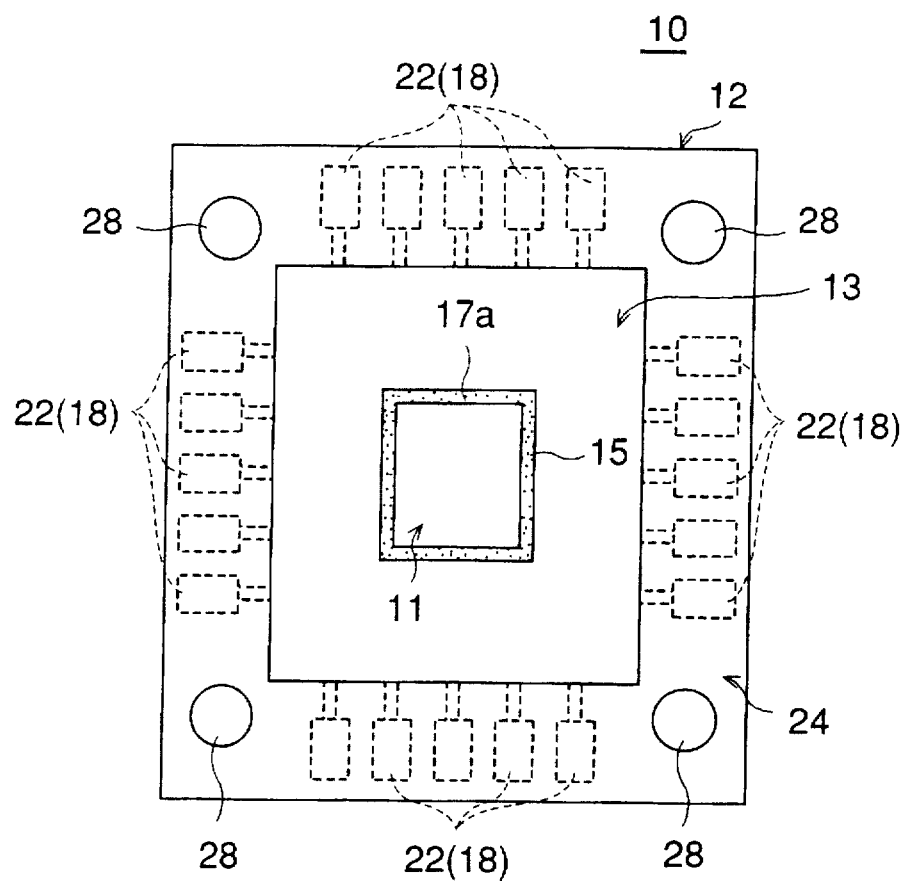
FIG. 4 is a plan view of the semiconductor device according to the first embodiment of the present invention.

The first embodiment of the present invention will be described with reference to FIGS. 3 and 4. FIG. 3 is a cross-sectional view of a semiconductor device 10 according to the first embodiment of the present invention and FIG. 4 is a plan view of the semiconductor device 10. The semiconductor device 10 is comprised of a semiconductor element 11, wiring board 12, supporting member 13, projecting electrodes 14 (the term "projecting electrode" used in this specification means any form of electrodes which project from a lower principle surface of a package body), sealing resin 15 and so on.

The semiconductor element 11 is a so-called bare chip and a plurality of bump electrodes 16 are formed underneath. The semiconductor element 11 is connected, electrically and mechanically, to the wiring board 12 by flip chip bonding.

The wiring board 12 is comprised of base film 17, leads 18, insulating membrane 19 and so on. The base film 17 is an insulated film made of, for example, polyimide and has a flexible property. The lead 18, which is made of a conductive metal such as copper foil and has a predetermined pattern, is formed in the base film 17.

The thickness of the base film 17 is thicker than that of the lead 18 or the insulating membrane 19 and its mechanical strength is also high. Thus, the leads 18 and the insulating membrane 19 are actually supported by the base film 17. Also, the wiring board 12 has a structure which can be bent since, as mentioned above, the base film 17 has a flexible property and the thickness of the lead 18 or the insulating membrane 19 is thin. Moreover, a mounting hole 17a for mounting the semiconductor element 11 is provided in substantially the center of the base film 17.

The number of leads 18 corresponds to the number of bump electrodes 16 provided underneath the semiconductor element 11. The lead 18 is comprised, integrally, of an inner lead portion 20, outer lead portion 21 and a pad portion 22 for measurement.

The inner lead portion 20 is located inside of the lead 18, as shown in the figure, and the bump electrodes 16 are connected to the inner lead portion 20. The outer lead portion 21, on the other hand, is located on the opposite side of the inner lead portion 29 and the projecting electrodes 14 are connected to the outer lead portion 29. The pad portion for measurement 22, which is located close to the periphery of the semiconductor device 10 as shown in the figure, is a portion to which a testing probe contacts (described later).

The insulating membrane 19 is a membrane coated by a insulative resin except for the portions where the lead 18 contacts the projecting electrodes 14 and the pad portion for measurement. The insulating membrane 19 has another function to protect the lead 18.

The supporting member 13 is made of metal material such as copper and aluminum. A cavity 23, which faces the mounting hole 17a of the base film 17 is formed in the center portion of the supporting member 13.

According to the present invention, the supporting member 13 has a rectangular or square shape and since the cavity 23 is formed in the supporting member 13, the supporting member 13, in consequence, has a shape of rectangular or square frame.

The wiring board 12 is fixed to a lower surface of the supporting member 13 using an adhesive so that the wiring board 12 having the flexible property, as mentioned above, is supported by the supporting member 13. Also, the inner lead portion 20 of the lead 18 is arranged so that it extends to inside of the cavity 23 when the wiring board 12 is combined with the supporting member 12. As mentioned above, the semiconductor element 11 is flip-chip bonded to the inner lead portion 20 extending to inside of the cavity 23. Thus, the semiconductor element 11 is positioned in the cavity 23.

The outer lead portion 21 of the lead 18 is arranged so that it is positioned at the other side of the supporting member 13 and, as mentioned above, the projecting electrodes 14 are connected to the outer lead portion 21. According to this embodiment of the present invention, solder bumps are used as the projecting electrodes 14. Each solder bump is provided in a predetermined position of the outer lead portion 21 where it is not covered by the insulating membrane 19. Thus, the semiconductor element 11 is electrically connected to the projecting (bump) electrodes 14 through the lead 18.

As mentioned above, the outer lead portion 21 to which the projecting electrodes 14 are connected, is located below the supporting member 13 and even if the wiring board 12 having a flexible property is used, deformation of the outer lead portion 21 may be prevented by the supporting member 13. Thus, no variation in location of each of the projecting electrodes 14 is caused and mountability of the device can be improved.

The pad portion 22 for measurement is located, as mentioned above, at the periphery portion of the semiconductor device 11 (hereinafter the region of the wiring board 12 where the pad portion 22 for measurement is provided is called a pad-for-measurement forming region 24). The pad-for-measurement forming region 24 is located outside of an outer periphery of the supporting member 13.

That is, the wiring board 12 has a larger area than the supporting member 13 and the pad portion 22 for measurement is formed underneath the pad-for-measurement forming region 24.

In the above mentioned configuration of the semiconductor device 10, the semiconductor element 11 is electrically connected to the projecting electrodes 14 and the pad-for-measurement forming region 24 via the inner lead portion 20 and the outer lead portion 21.

The cavity 23, inside of which the semiconductor element 11 is provided, is filled with the sealing resin 15 in order to protect the semiconductor element 11 as well as the inner lead portion 20 of the lead 18. The numeral 28 shown in FIG. 4 indicates a positioning hole for correctly positioning the semiconductor device 10.

The operation and the function of the semiconductor device 10 having the above-mentioned configuration at the time of testing will be described as follows.

It is necessary to carry out a reliability test for the semiconductor device 10. The test is performed using a probe (testing needle) which is connected to a testing device. During the test, the probe is electrically connected to the semiconductor device 10 to check the operation of the device. Conventionally, since the probe directly contacts the electrodes of a semiconductor device, as mentioned above, there are problems of damaging the electrodes.

According to the present invention, however, since the pad portion 22 for measurement is provided closer to the periphery of the semiconductor device 10 than the outer lead portion 21 of the lead 18 to which the projecting electrodes 18 are connected, it is possible to perform the reliability test of the semiconductor device 11 using the pad portion 22 for measurement.

One of the practical procedures for such a test can be carried out by introducing the probe 25 underneath the pad-for-measurement forming region 24 and contacting the probe 25 to the pad portion 22 for measurement as shown in FIG. 3. At this time, since no supporting member is provided above the pad-for-measurement forming region 24, the pad-for-measurement forming region 24 bends if pushed by the probe 25 due to its flexibility. Since the pad-for-measurement forming region 24 has an elastic recovery force to push back the probe 25, an electrical contact between the pad portion 22 for measurement and the probe 25 can be assured.

Also, as mentioned above, since the probe 25 contacts the pad portion 22 for measurement, not the protruding electrodes 14, it is possible to protect the protruding electrodes 14 from damage caused by contact with the probe 25. Thus, the height and the shape of the projecting electrodes 14 can be kept intact so that the mountability of the semiconductor device can be improved.

Moreover, since the pad portion 22 for measurement is provided outside of the projecting electrodes 14, it is possible to perform the electrical connection test even after the projecting electrodes 14 are mounted on a mounting board 26 (indicated by the dotted line in FIG. 3). That is to say, the test can be carried out, conventionally, only for the projecting electrode 14a, which is located most outside among the electrodes 14, once the electrodes 14 are mounted on the mounting board 26 since the probe 25 cannot reach the other projecting electrodes 14 which are located inside of the electrode 14a.

According to the present invention, however, since the pad portion 22 for measurement is provided outside of the projecting electrodes 14, as shown in FIG. 4, and the pad portion is formed as a flat plate, the electrical connection and operation test can be carried out even after the semiconductor device 10 is mounted. By this way, the reliability of the semiconductor device 10 after mounting can be assured.

It seems that the size of the semiconductor device 10 is increased due to the formation of the pad-for-measurement forming region 24. However, this problem can be solved by cutting the pad-for-measurement forming region 24 after the completion of the above mentioned test. This will be explained next referring to FIGS. 5 and 6.

Figure 5:
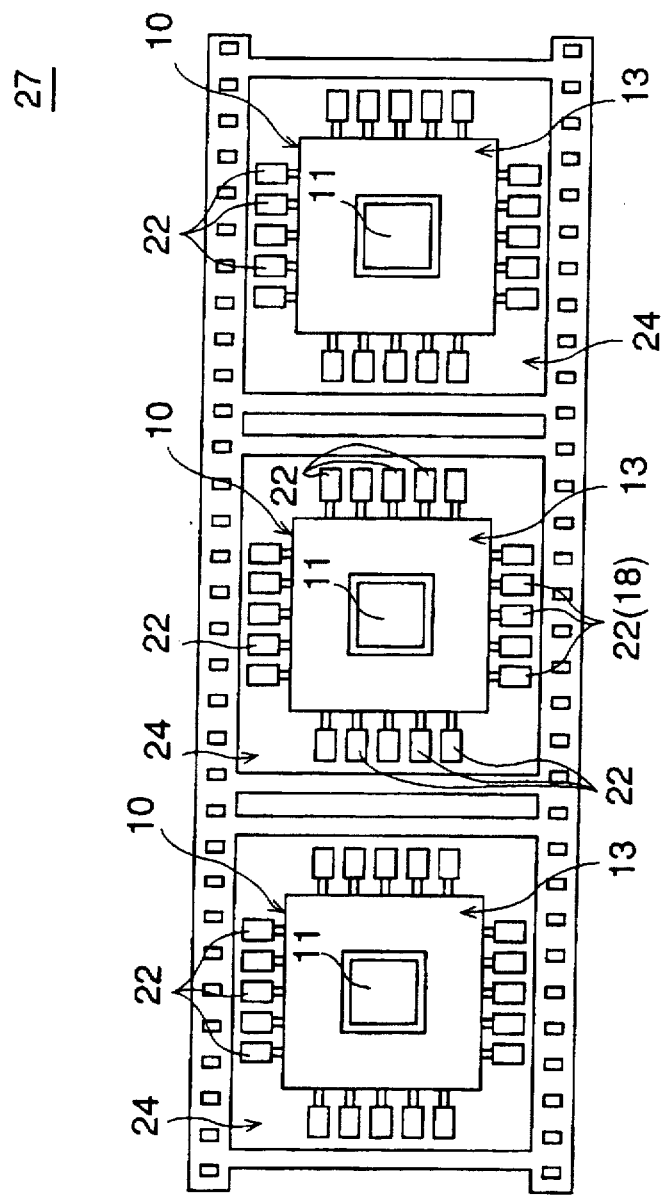
FIG. 5 shows a plurality of the semiconductor device according to the first embodiment of the present invention which are in a testing process.
Figures 6A, 6B:
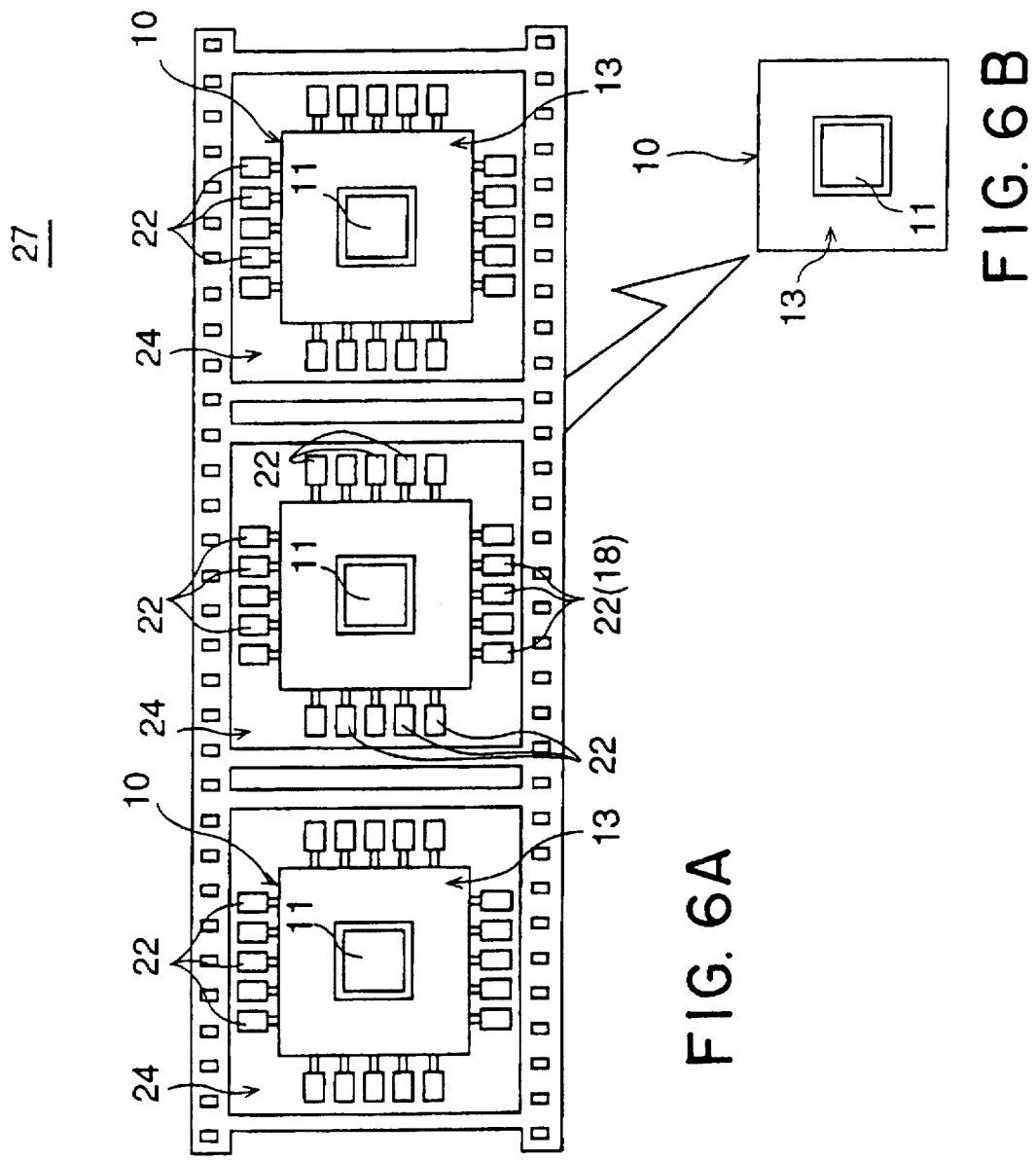
FIG. 6 shows a cutting process of a plurality of the semiconductor device according to the first embodiment of the present invention which have passed through the testing process.

FIG. 5 shows a plurality of the semiconductor devices 10 which are in the testing process. FIG. 6 shows a cutting process of the plurality of the semiconductor device 10 which have passed through the testing process.

As shown in FIG. 5, the testing process is performed for a number of the semiconductor devices 10 which are connected each other by a film carrier 27 (united with the base film 17 of the wiring board 12) in order to increase efficiency of the test. Then, as shown in FIG. 6, the cutting process of the film carrier 27 is carried out, after the completion of the test, to produce an individual semiconductor device 10.

When the film carrier 27 is cut, the cutting position of the film 27 is set to the outer periphery of the supporting member 13. The setting of the position may easily be carried out by appropriately forming a mold for cutting the film carrier 27. By this way, a small-size semiconductor device 10 having high reliability can be produced without increasing steps for its production. Also, if the reliability test is carried out after mounting on the mounting board, the pad-for-measurement forming region 24 can be cut at the position indicated by the line A—A shown in FIG. 3 after performing the test.

Next, a second embodiment according to the present invention will be explained as follows.

Figure 7:
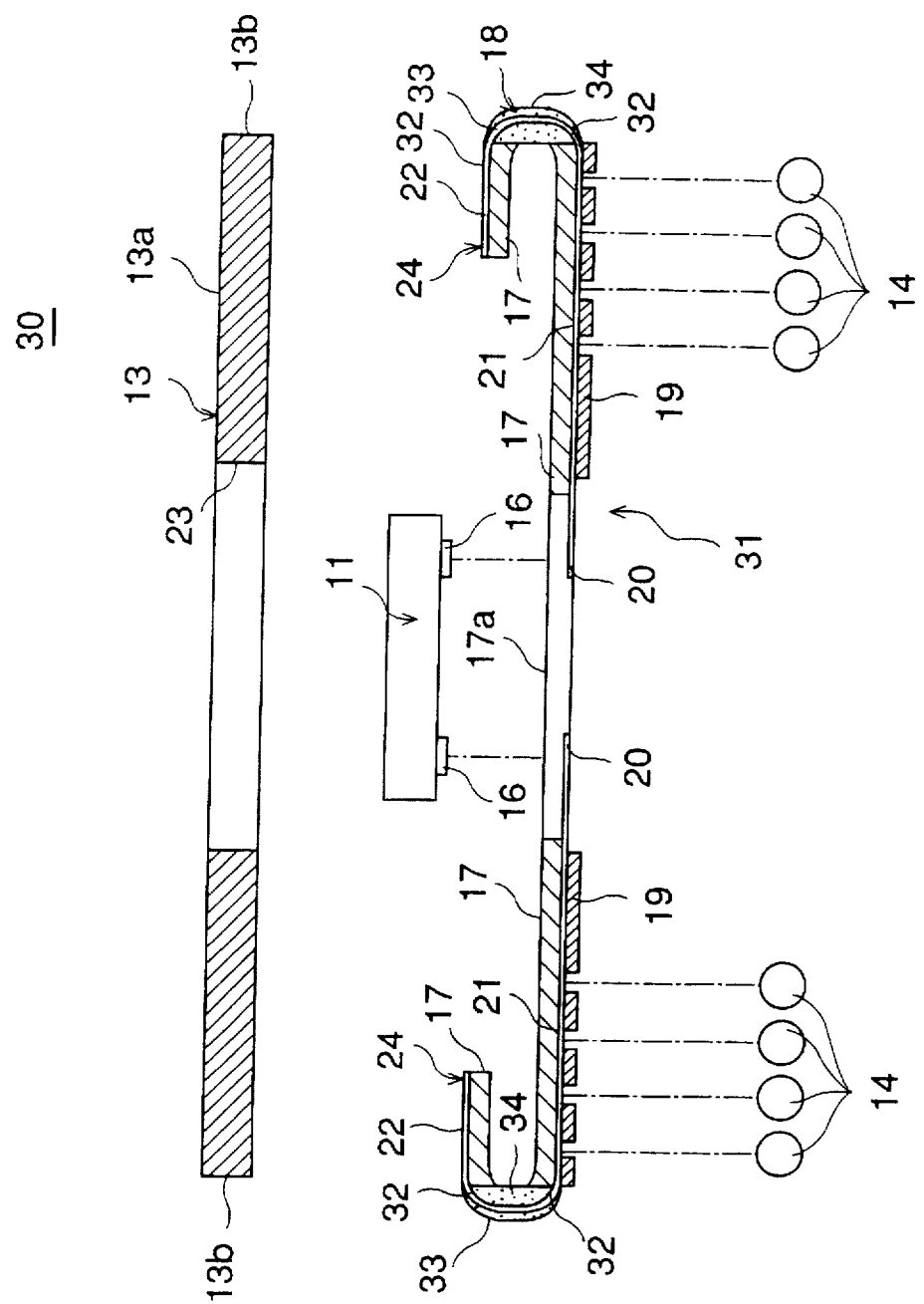
FIG. 7 is a diagram showing an exploded view of the semiconductor device according to the second embodiment of the present invention.
Figure 8:
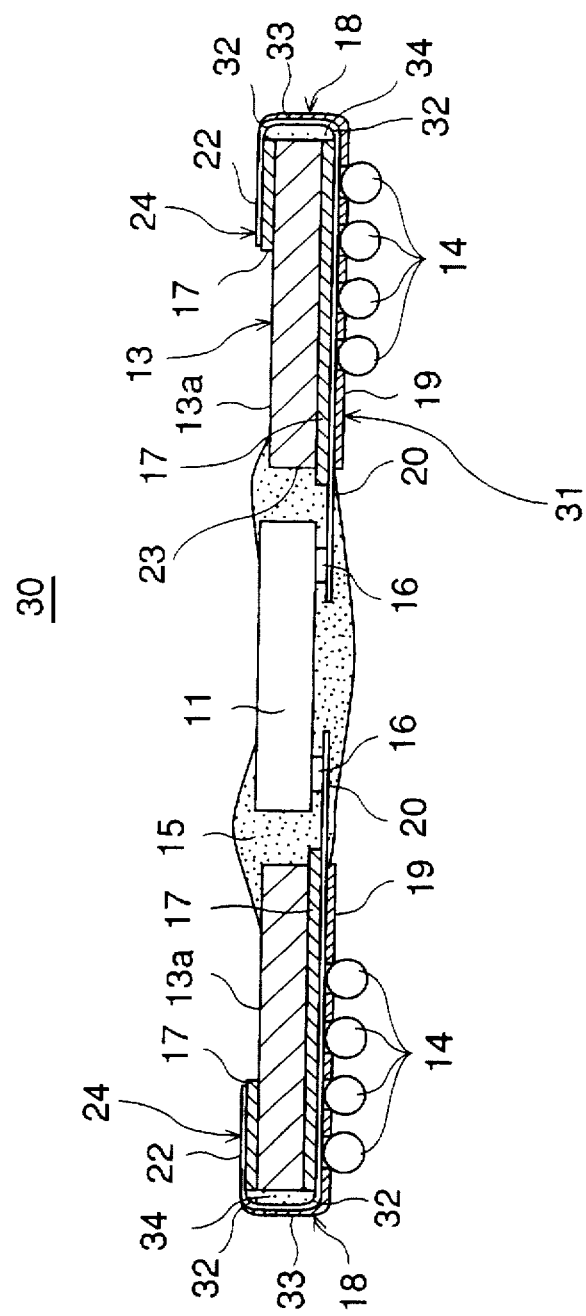
FIG. 8 is a diagram showing a cross-sectional view of the semiconductor device according to the second embodiment of the present invention.
Figure 9:
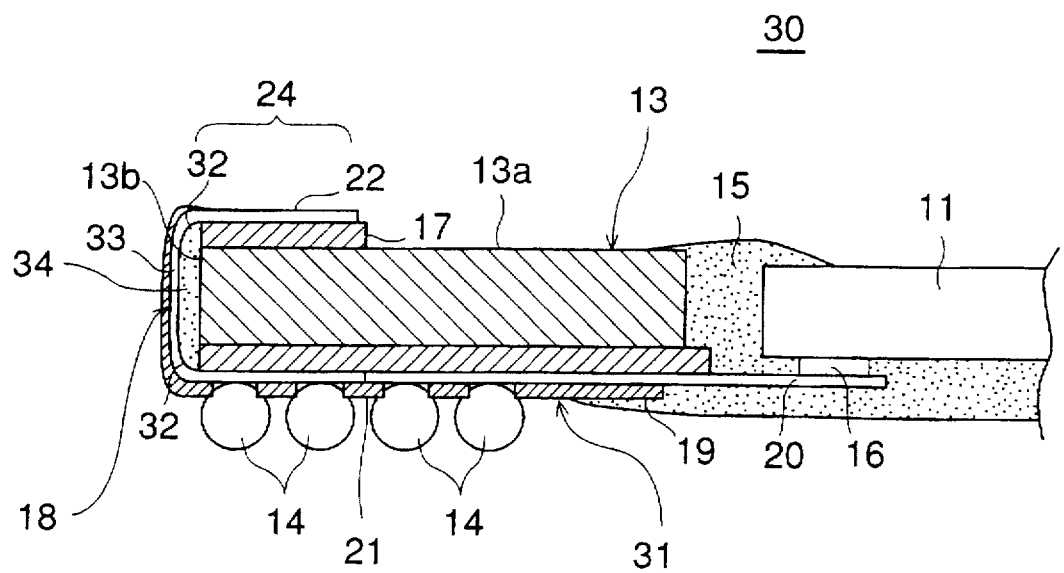
FIG. 9 shows main parts of the semiconductor device according to the second embodiment of the present invention in magnified scale.

FIGS. 7, 8 and 9 show a semiconductor device 30 according to the second embodiment of the present invention. FIG. 7 is a diagram showing an exploded view of the semiconductor device 30. FIG. 8 is a diagram showing a cross-sectional view of the semiconductor device 30 and FIG. 9 shows main parts of the semiconductor device 30 in magnified scale. Note that elements which are the same as the ones in FIGS. 3 and 4 are indicated by the same reference numerals and an explanation thereof will be omitted.

The semiconductor device 30 according to the second embodiment is characterized by bending a wiring board 31 along a supporting member 13 so as to provide a pad portion 22 for measurement on the upper surface 13a of the supporting member 13.

The wiring board 31 according to the second embodiment of the present invention is comprised of, similar to the one used in the first embodiment, base film 17, leads 18 and insulating membrane 19. However, the wiring board 31 is not provided with the base film 17 at a bending portion 32 and an opposing portion 33 opposite to a side surface 13b of the supporting member 13. Instead, the above mentioned portions 32 and 33 are filled with a flexible resin 34.

The wiring board 31 having the above-mentioned configuration can easily bend to form the shape shown in FIG. 7. The flexible resin 34 used instead of the base film 17 is an insulative resin having a predetermined viscosity (for example, a resist employed in a production process of a semiconductor device), which is capable of allowing the bending of the base film 17 and supporting the exposed lead 18 at the same time.

Figure 10:
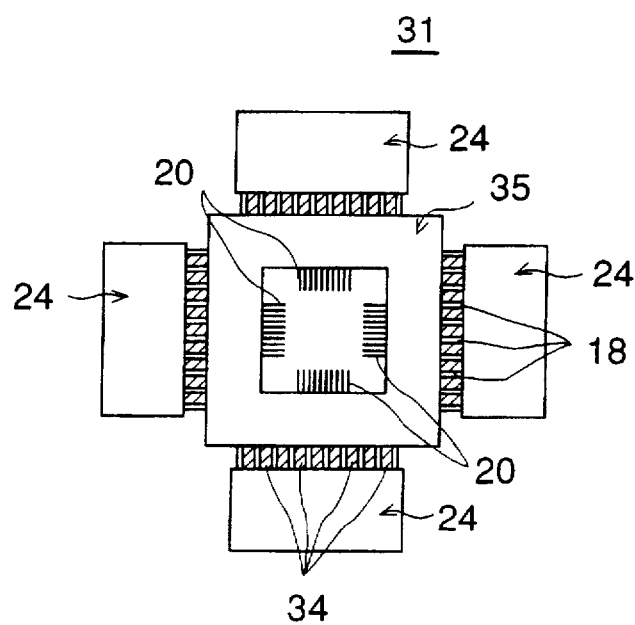
FIG. 10 is a diagram showing a plan view of a wiring board used for the semiconductor device according to the second embodiment of the present invention.

FIG. 10 is a diagram showing a plan view of the wiring board 31, prior to the bending, having the above-mentioned configuration. As shown in FIG. 10, the wiring board 31 is comprised of a main body 35, to which an inner lead portion 20 and an outer lead portion 21 are provided, and a pad-for-measurement forming region 24 in which the pad portion 22 for measurement is formed. A semiconductor element 11 and projecting electrodes 14 are provided with the main body 35 of the wiring board 31.

According to this embodiment, the pad-for-measurement forming region 24 has a rectangular shape and four of these regions are provided for a device so as to provide each of the regions opposite to one of the four sides of the main body 35 having a square or substantially square shape as shown in FIG. 10. Each of the pad-for-measurement forming region 24 is connected to the main body 35 by the lead 18. The flexible resin 34 is provided between the pad-for-measurement forming region 24 and the main body 35.

When the semiconductor device 30 is produced, the semiconductor element 11 is flip-chip bonded to the inner lead portion 20 provided with the main body 35 of the wiring board 31 and then the supporting member 13 is combined with the main body 35 using an adhesive. The supporting member 13 has a shape corresponding to the shape of the main body 35.

The portions which extend from the main body 35 and the supporting member 13 are bent along the supporting member 13 and the pad-for-measurement forming region 24 is fixed to the upper surface of the supporting member 13 using, for instance, an adhesive. Finally, sealing resin 15 is filled in a cavity 23 formed in the supporting member 13 to produce the semiconductor device 30.

Figure 11:
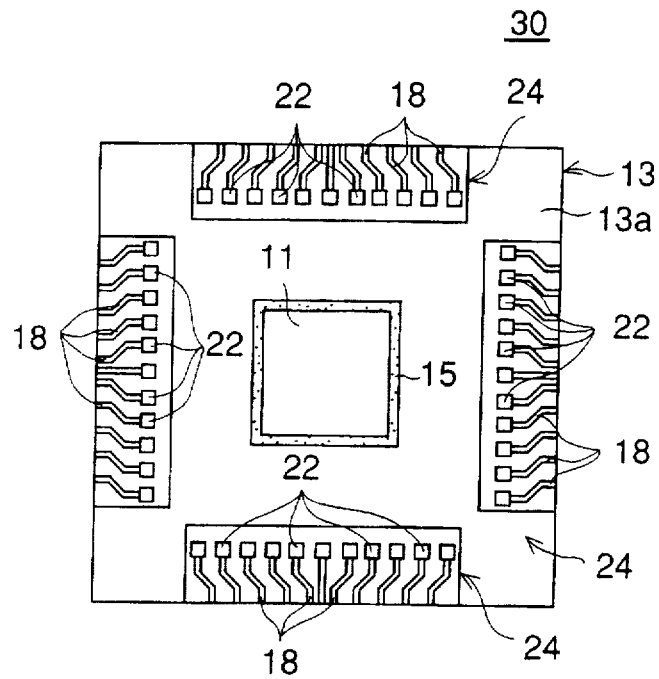
FIG. 11 is a diagram showing a plan view of the semiconductor device according to the second embodiment of the present invention.

FIG. 11 is a diagram showing a plan view of the semiconductor device 30. As shown in FIG. 11, four pad-for-measurement forming regions 24 are formed on a respective surface 13a of the supporting member 13 and the pad portions 22 for measurement formed on the pad-for-measurement forming region 24 are exposed.

As can be seen from the figure, an electrical operation test (reliability test) can easily be performed on the semiconductor device 30 having the pad portions 22 for measurement on the upper surface 13a of the supporting member 13.

Figure 1:
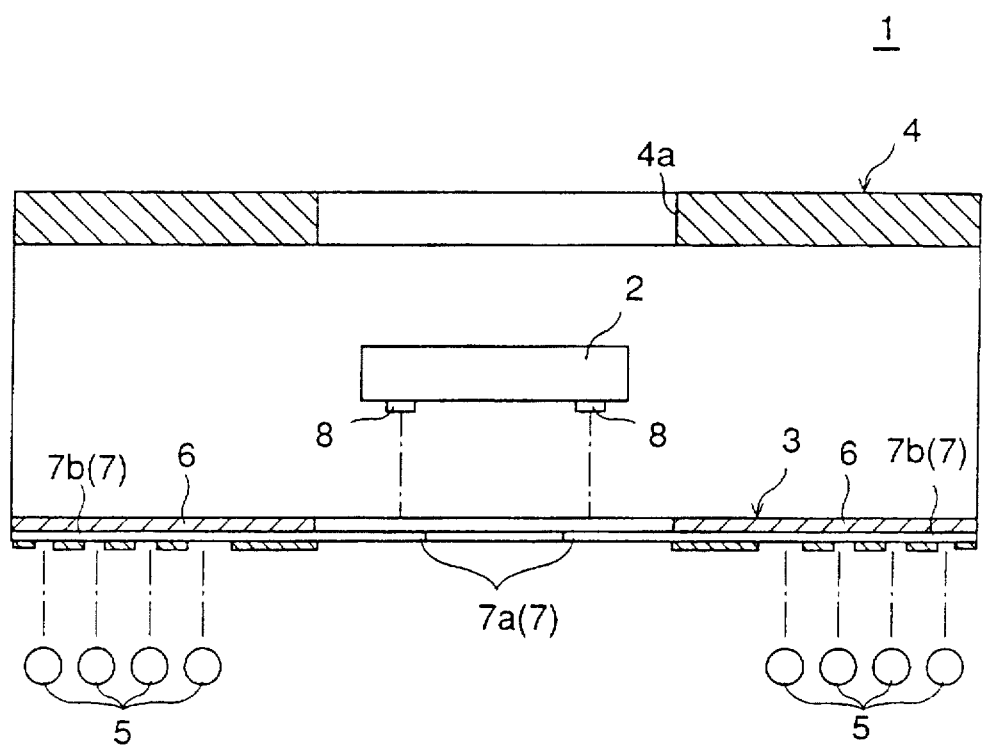
FIG. 1 shows an exploded view of a conventional T-BGA type semiconductor device.
Figure 2:
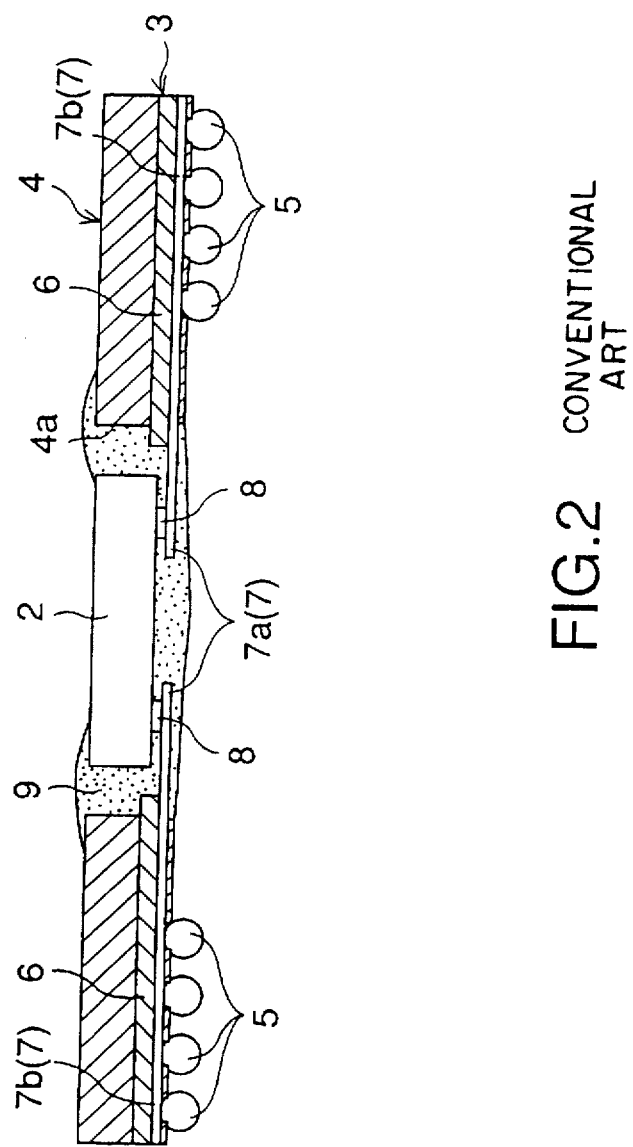
FIG. 2 is a cross-sectional view of a conventional T-BGA type semiconductor device.

Compared with the semiconductor device 10 according to the first embodiment in which the pad portions 22 for measurement formed in the pad-for-measurement forming region 24 are covered by the base film 17 and cannot be seen from an upper direction (refer to FIG. 1), the semiconductor device 30 according to this embodiment has the pad portions 22 for measurement on the upper surface 13a of the supporting member 13 so that the probe 25 can easily and surely contact the pad portions 22 during a testing procedure.

Also, according to the semiconductor device 30 of this embodiment, it is not necessary to cut out the pad-for-measurement forming region 24 after the completion of the test. Thus, the production steps of the device can be decreased. Moreover, the test can be performed before and/or after mounting the semiconductor device 30 on the mounting board.

Figure 12:
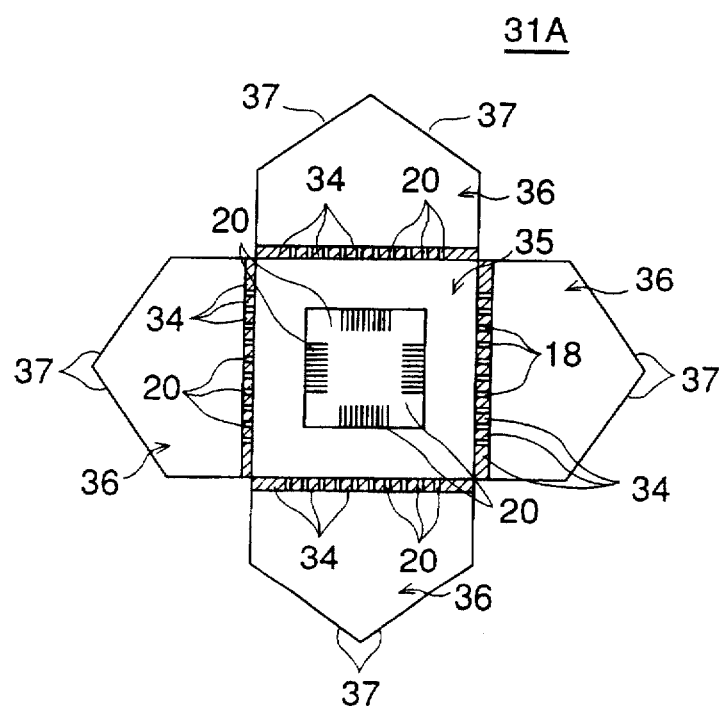
FIG. 12 is a diagram showing a plan view of a modified embodiment of the wiring board according to the present invention.
Figure 13:
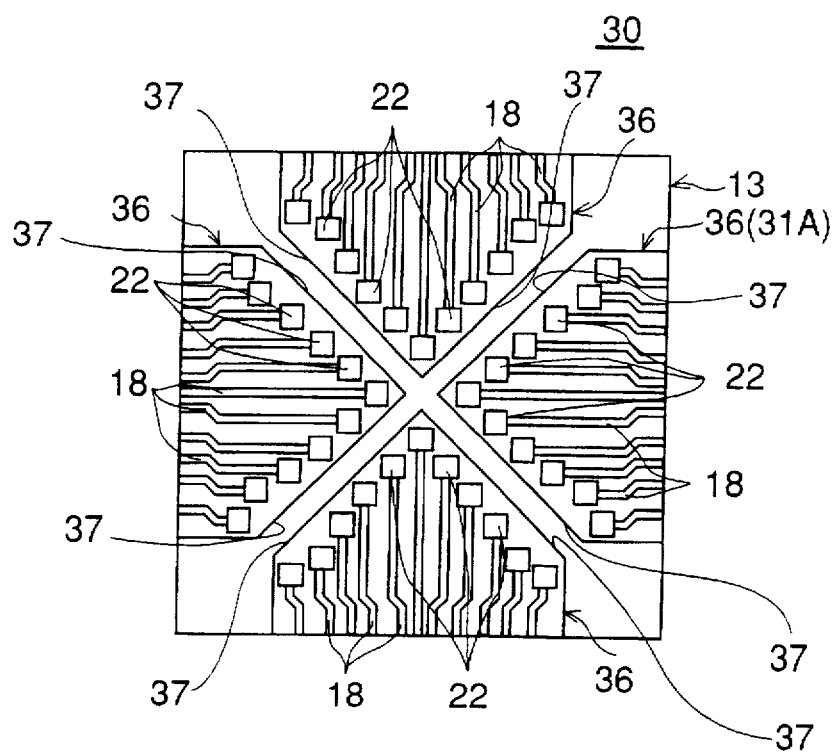
FIG. 13 is a diagram showing a plan view of a semiconductor device in which the wiring board shown in FIG. 12 is used.

FIGS. 12 and 13 show an embodiment of a modification of the wiring board 31 used in the second embodiment of the present invention. FIG. 12 is a diagram showing a plan view of the modified wiring board 31A and FIG. 13 is a diagram showing a plan view of a semiconductor device 30 in which the wiring board 31A is used. Note that elements which are the same as the ones in the second embodiment are indicated by the same reference numerals and explanations thereof will be omitted for simplification.

The wiring board 31A is characterized by a plurality (four in this embodiment) of pad-for-measurement forming regions 36 on which pad portions 22 for measurement are formed, each of which has at least one inclining side 37.

For example, each the pad-for-measurement forming region 36 of the wiring board 31A has a pentagonal shape having two inclining sides 37 as shown in FIG. 12. Note that flexible resin 34 is also used between the main body 35 and each of the pad-for-measurement forming region 36 instead of the base film 17.

The significance of making the shape of the pad-for-measurement forming region 36 pentagonal with two inclining sides is that it is now possible to provide the pad portions 32 for measurement along the inclining sides 37. In this way, the space between each of the pad portions 32 can be widened and this makes it easy to contact the probe 25 to a targeting portion during the reliability test.

Also, according to this embodiment, if the number of bump electrodes 16 is increased as a result of a highly integrated semiconductor element 11, it is possible to cope with it since a pad pitch between the adjacent pad portions may be widened.

Note that although the pad-for-measurement forming region 36 having a pentagonal shape is shown in FIGS. 12 and 13, the shape is not so limited to a pentagon and it is sufficient if at least one side of the pad-for-measurement forming region 36 is an inclining side so as to provide the effect of the present embodiment.

Figure 14:
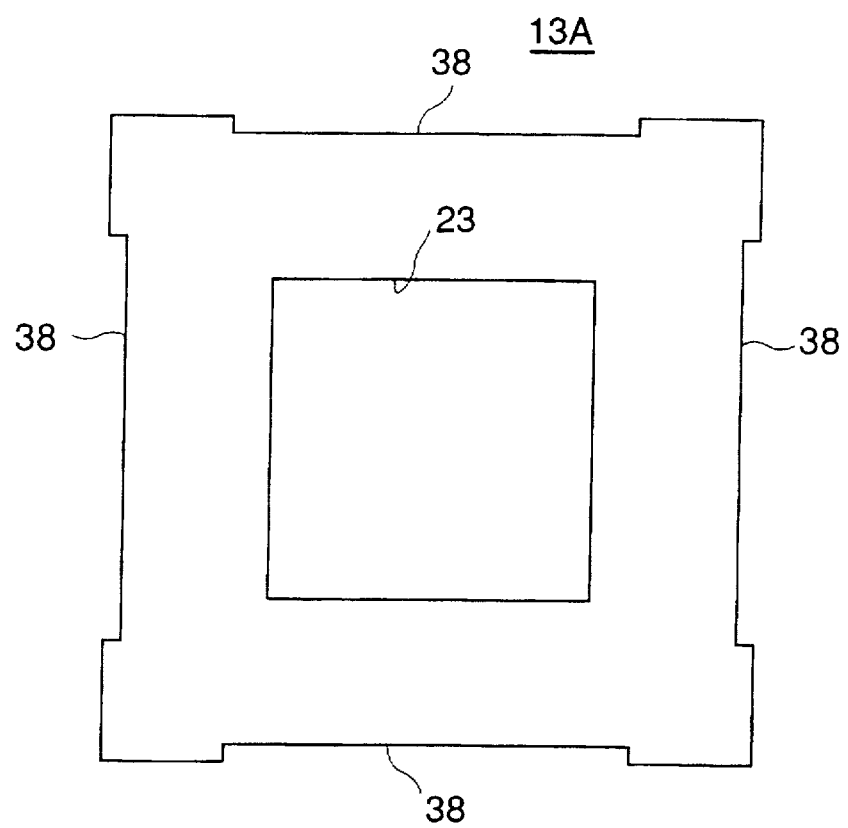
FIG. 14 is a diagram showing a plan view of a modified embodiment of the supporting member according to the present invention.
Figure 15:
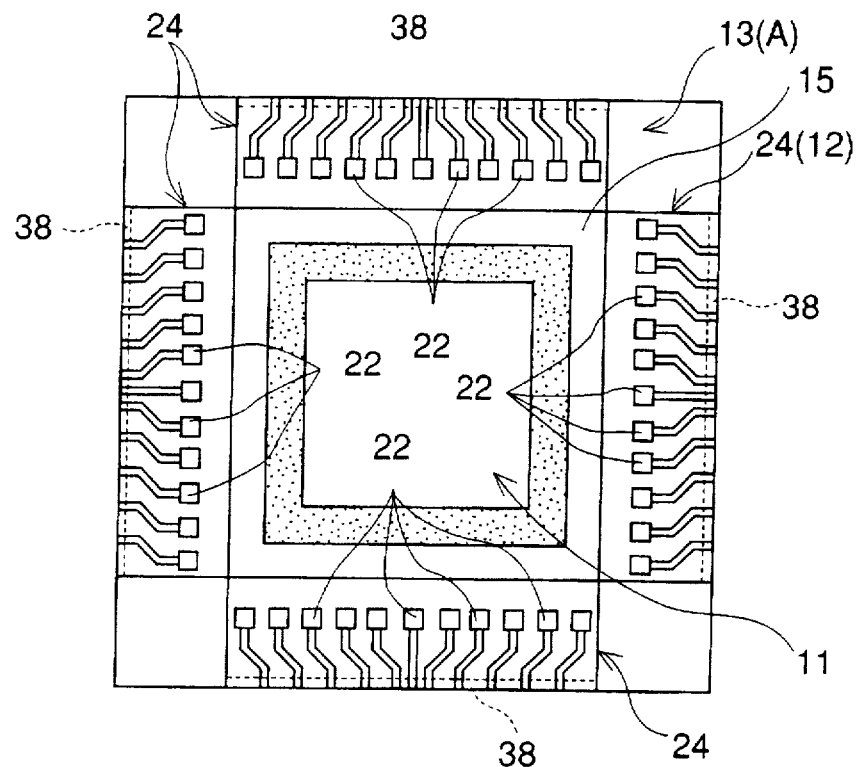
FIG. 15 is a diagram showing a plan view of a semiconductor device in which the supporting member shown in FIG. 14 is used.

FIGS. 14 and 15 show an embodiment of a modification of the supporting member 13 used in the second embodiment of the present invention. FIG. 14 is a diagram showing a plan view of the modified supporting member 13A and FIG. 15 is a diagram showing a plan view of a semiconductor device 30 in which the supporting member 13A is used. Note that elements which are the same as the ones in the second embodiment are indicated by the same reference numerals and explanations thereof will be omitted for simplification.

The supporting member 13A according to this embodiment is characterized by a guiding concave portion 38 for guiding a bending position of the wiring board 12 (or 31)

provided at the side surface 13b of the supporting member 13A. The size of the guiding concave portion 38 corresponds to the width of the pad-for-measurement forming region 24 (36) so that the pad-for-measurement forming region 24 (36) just fits the concave portion 38.

Due to the formation of the guiding concave portion 38 of the supporting member 13A, positioning of a bending portion of the wiring board 12 (31) can be achieved by the guiding concave portion 38. Thus, as shown in FIG. 15, the pad-for-measurement forming region 24 (36) can be positioned in a predetermined place with high accuracy so that if the electrical connection test is made automatically, the probe 25 can positively contact the pad portions 22 for measurement.

Next, three different types of modified embodiments of the semiconductor device 30 according to the above second embodiment of the present invention will be described.

Figure 16:
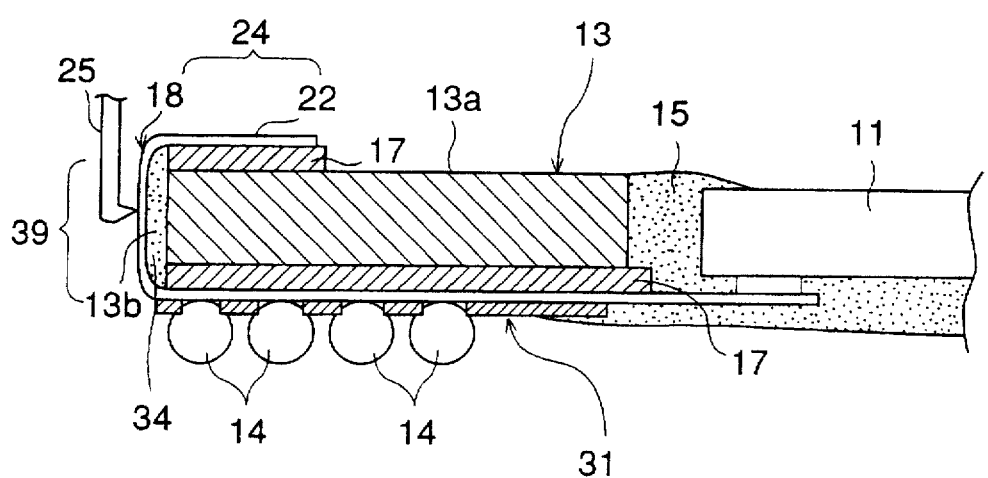
FIG. 16 is a diagram showing a cross-sectional view of a modified embodiment of the semiconductor device according to the second embodiment of the present invention.
Figure 17:
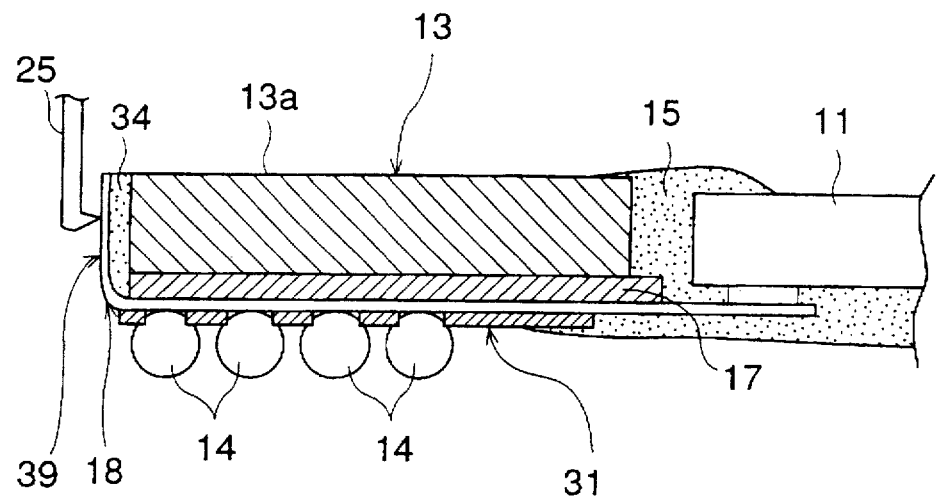
FIG. 17 is a diagram showing a cross-sectional view of another modified embodiment of the semiconductor device according to the second embodiment of the present invention.
Figure 18:
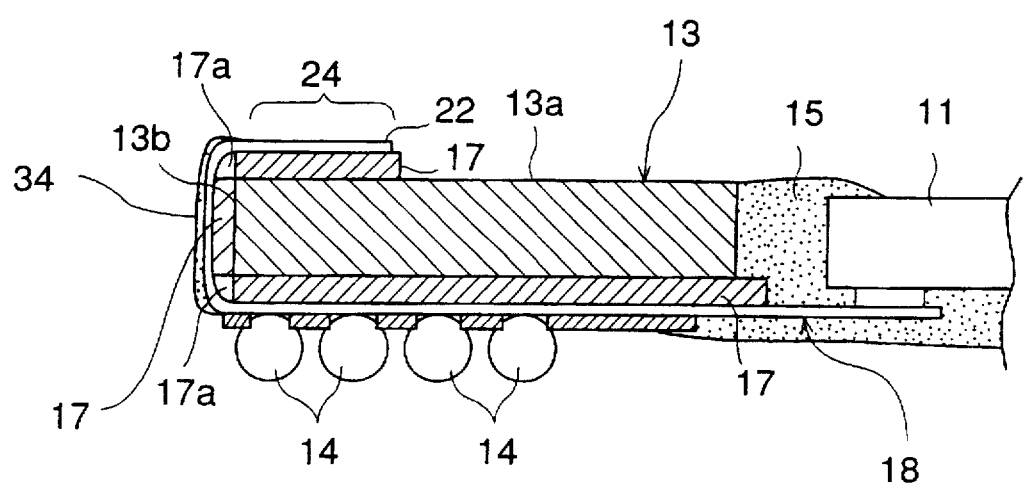
FIG. 18 shows a cross-sectional view of other modified embodiment of the semiconductor device according to the second embodiment of the present invention.

FIGS. 16, 17 and 18 show, respectively, a modified embodiment of the semiconductor device 30 according to the second embodiment of the present invention. FIG. 16 is a diagram showing a cross-sectional view of a modified semiconductor device 30A. FIG. 17 is a diagram showing a cross-sectional view of another modified semiconductor device 30B and FIG. 18 shows a cross-sectional view of other modified semiconductor device 30C. Note that elements which are the same as the ones in the semiconductor device 30 of the second embodiment are indicated by the same reference numerals and explanations thereof will be omitted.

First, the semiconductor device 30A will be explained with reference to FIG. 16. Although the semiconductor device 30 of the second embodiment employs the flexible resin 34 on both sides of the lead 18 to protect it, the semiconductor device 30A is characterized by non-use of the flexible resin and an exposure of the lead 18 as shown in FIG. 16.

Since the semiconductor device 30A has the above-mentioned structure, it is possible to utilize the side (i.e., the side which is opposite to the side portion 13b of the supporting member 13) of the semiconductor device as a second pad-for-measurement forming region 39 in addition to the (first) pad-for-measurement forming region 24 which is provided also with the semiconductor device 30. Therefore, according to the semiconductor device 30A, it is possible to use selectively, or even simultaneously, the first and the second pad-for-measurement forming region 24 and 39. Thus, the process of contacting the probe 25 to the pad portions during the testing procedure may be simplified.

Next, the semiconductor device 30B will be explained with reference to FIG. 17. The semiconductor device 30B is characterized by a removal of the first pad-for-measurement forming region 24 compared with the semiconductor device 30A shown in FIG. 16. Thus, according to the semiconductor device 30B, the electrical connection test is carried out by contacting the probe 25 to the pad-for-measurement forming region 39.

According to the semiconductor device 30B, since the area of the wiring board 31 is small, it is possible to reduce the material cost of the wiring board 31 and hence the cost of the semiconductor device 30B. Also, the pad-for-measurement forming region 39 provided with the side portion of the semiconductor device 30B is sufficient to carry out the electrical connection test, without damaging the projecting electrodes 14, even after the mounting of the device.

Next, the semiconductor device 30C will be explained with reference to FIG. 18. The semiconductor device 30C is characterized by formation of slits 17a of the base film 17 at the positions where the base film 17 is bent.

According to the semiconductor device 30C having the above structure, since the base film 17 is not removed and still remains in the position opposite to the side portion 13b of the supporting member 13, it is possible to protect the lead 18 during the bending process. Also, since the amount of the flexible resin used can be decreased, the cost of the construction of the semiconductor device 30C can be decreased.

Next, a third embodiment according to the present invention will be described.

Figure 19:
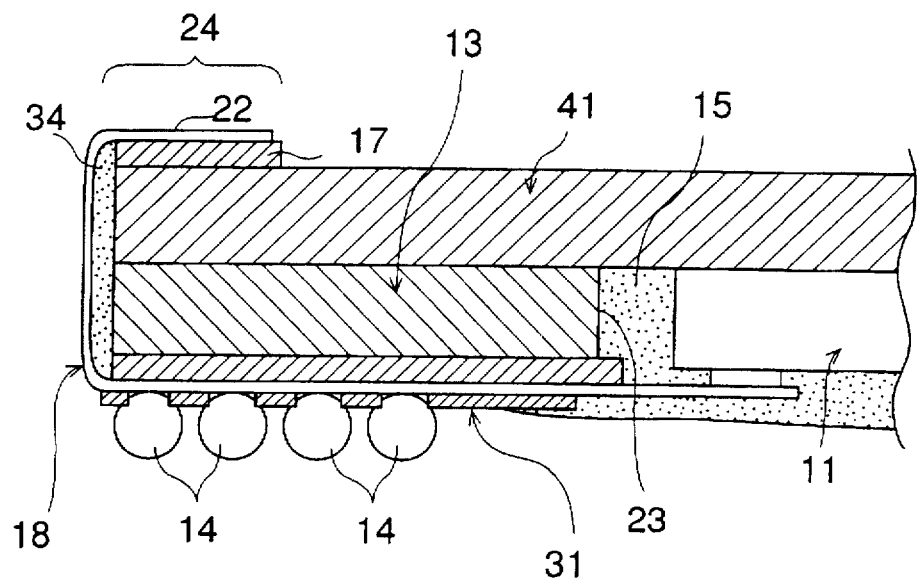
FIG. 19 shows a semiconductor device according to the third embodiment of the present invention.

FIG. 19 shows a semiconductor device 40 according to the third embodiment of the present invention. In FIG. 19, elements which are the same as the ones in the semiconductor device 30 of the above-mentioned second embodiment are indicated by the same reference numerals and explanations thereof will be omitted.

The semiconductor device 40 according to this embodiment is characterized by an addition of a heat-dissipating plate 41 connected thermally to the semiconductor element 11. The heat-dissipating plate 41 is made of a metallic material, such as copper and aluminum, having an excellent heat conductivity and its size is adjusted so that it covers the supporting member 13 in this embodiment.

The heat-dissipating plate 41 is fixed to the upper surface of the supporting member 13 using an adhesive or other appropriate securing means. Also, when fixed, a part of a lower surface of the heat-dissipating plate 41 is contacted to the semiconductor element 11 so that the heat generated from the semiconductor element 11 may be transferred to the heat-dissipating plate 41.

Figure 20:
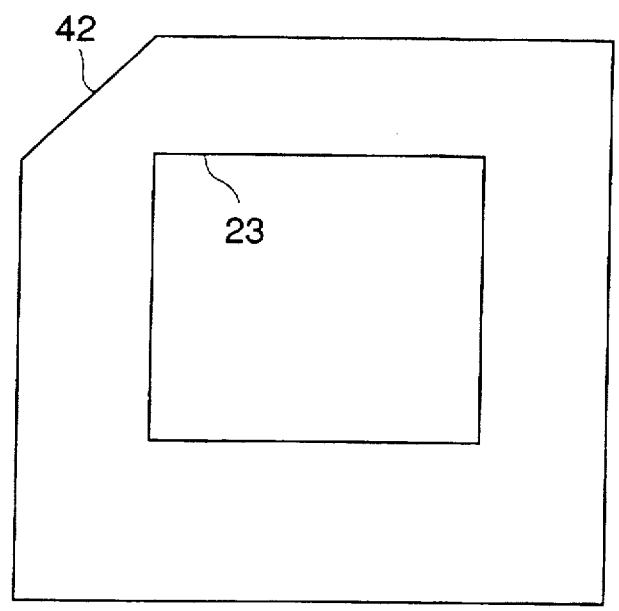
FIG. 20 shows a supporting member used in the semiconductor device shown in FIG. 19.
Figure 21:
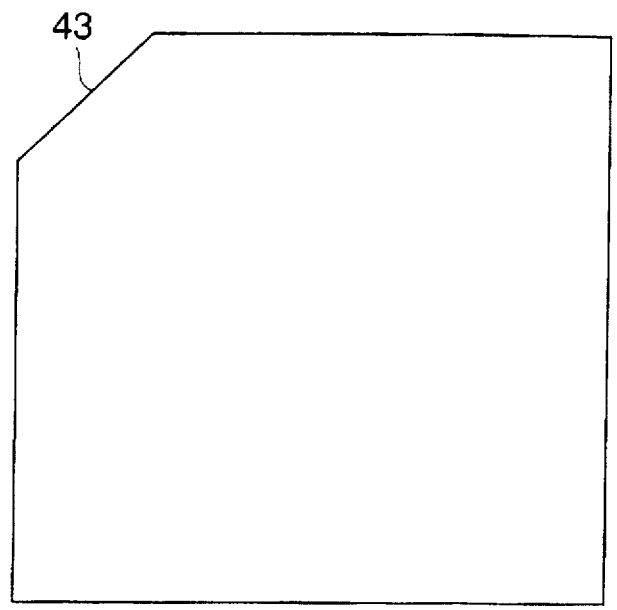
FIG. 21 shows a heat-dissipating plate used in the semiconductor device shown in FIG. 19.

In order to appropriately carry out the bending process of the wiring board 31 according to this embodiment, it is necessary to perform a precise positioning of the supporting member 13 and the heat-dissipating plate 41 so that a shift of the two does not occur during the above fixing step. Therefore, as shown in FIGS. 20 and 21, a cutting portion 42 or 43 having the same shape is provided with the supporting member 13 and the heat-dissipating plate 41, respectively.

In the above mentioned configuration, the positioning of the supporting member 13 and the heat-dissipating plate 41 can easily be carried out by superimposing the cutting portions 42 and 43. Also, according to the semiconductor device 40 having the above-mentioned structure of this embodiment, since the heat-dissipating plate 41, which is thermally contacted to the semiconductor element 11, is provided, it is possible to efficiently release the heat generated by the element 11 so as to provide for correct operation of the element 11. Moreover, it is possible to further increase the heat releasing efficiency by using materials having an excellent heat conduction property for the supporting member 13.

Figure 22:
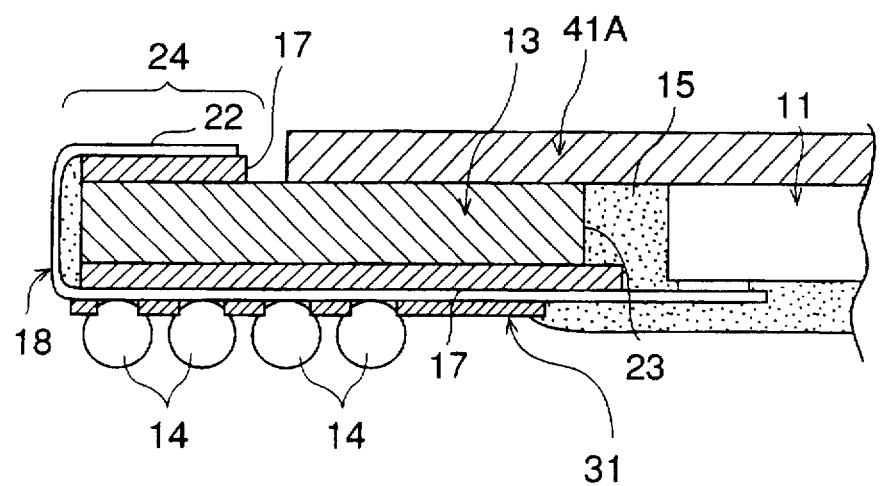
FIG. 22 is a diagram showing a modified embodiment of the semiconductor device according to the third embodiment of the present invention.

FIG. 22 is a diagram showing a modified embodiment of the semiconductor device 40 according to the third embodiment of the present invention.

The modified semiconductor device 40A is characterized by a smaller area of the heat-dissipating plate 41A relative to the area of the supporting member 13 so that the pad-for-measurement forming region 24 may be accommodated on the upper surface 13a of the supporting member 13 next to the heat-dissipating plate 41A as shown in FIG. 22.

According to the semiconductor device 40A having the above structure, it is possible to reduce the size of the semiconductor device as compared with the one having the pad-for-measurement forming region 24 on the heat-dissipating plate 41A.

Next, a fourth embodiment of the present invention will be described.

Figure 23:
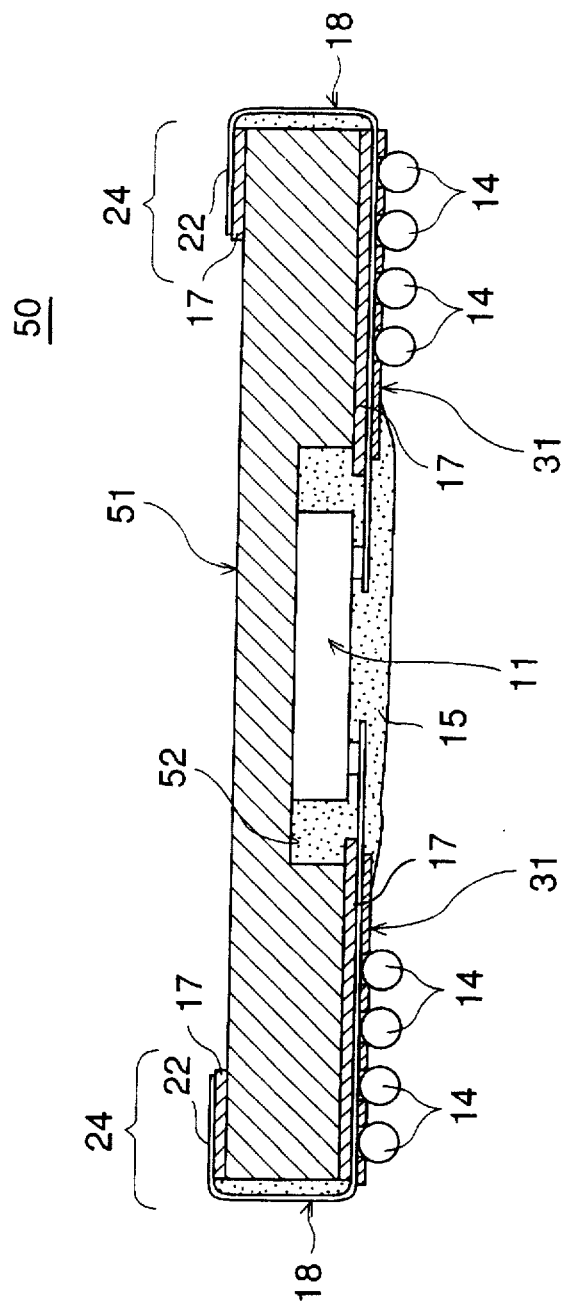
FIG. 23 shows a semiconductor device according to the fourth embodiment of the present invention.

FIG. 23 shows a semiconductor device 50 according to the fourth embodiment of the present invention. In FIG. 23, elements which are the same as the ones in the semiconductor device 30 of the above-mentioned second embodiment are indicated by the same reference numerals and explanations thereof will be omitted.

The semiconductor device 50 is characterized by a structure of a supporting member 51 in which the function of the supporting member 13 and that of the heat-dissipating plate 41 are united.

That is, the supporting member 51 according to this embodiment is made of a metallic material such as copper and aluminum having a high thermal conductivity and is thermally connected to the semiconductor element 11.

A cavity (non-penetrating) 52 is formed in the center of the supporting member 51 so that the upper surface of the semiconductor element 11 makes contact with the lower surface of the cavity 52 when the wiring board 31 is combined with the supporting member 51. In this configuration, the semiconductor element 11 is thermally connected to the supporting member 51.

According to the semiconductor device 50 having the above-mentioned structure, it is possible to use the supporting member 51 as a heat-dissipating plate. Thus, a number of construction parts may be reduced, without reducing the heat-releasing efficiency, compared with the semiconductor device 40 of the third embodiment having the supporting member 13 and the heat-dissipating plate in a separated state.

Next, fifth to seventh embodiments according to the present invention will be described with reference to FIGS. 24 to 26. Note that elements which are the same as the ones in the semiconductor device 50 of the above-mentioned fourth embodiment are indicated by the same reference numerals and explanations thereof will be omitted.

The semiconductor devices 60A to 60C according to the fifth to seventh embodiments of the present invention are characterized by a sealing structure of the semiconductor element 11.

Figure 24:
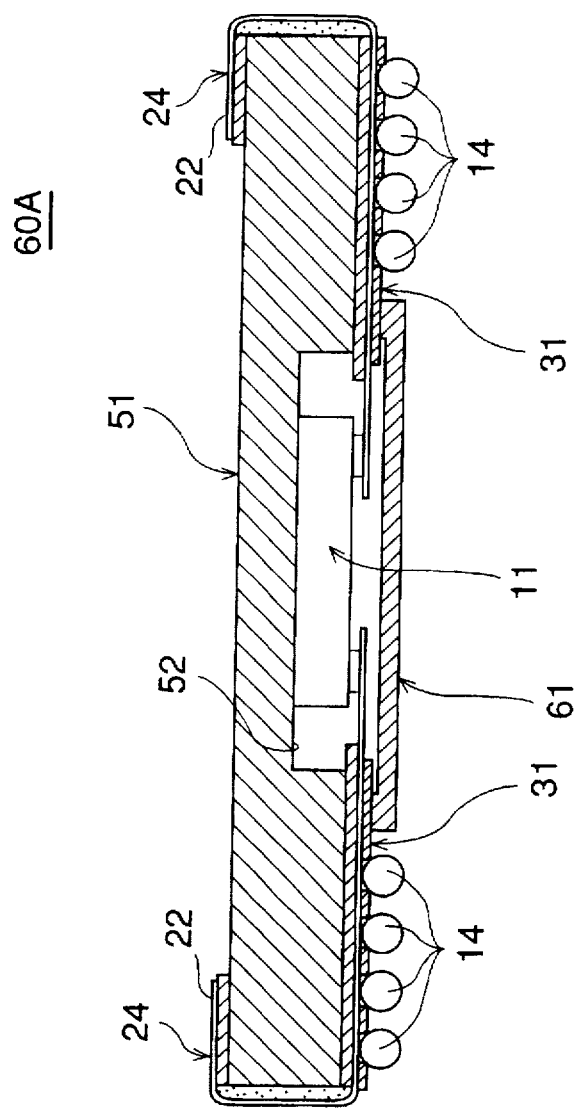
FIG. 24 shows a semiconductor device according to the fifth embodiment of the present invention.

FIG. 24 shows a semiconductor device 60A according to the fifth embodiment of the present invention. In the semiconductor device 60A, the semiconductor element 11 is sealed in an air-tight manner in the cavity 52. More specifically, a cap 61 is fixed to the supporting member 51 via the wiring board 31 by maintaining an air-tight state of the cavity 52. Since the semiconductor element 11 may be highly sealed while maintaining an excellent heat-releasing ability, as mentioned above, the reliability of the semiconductor device 60A can be improved.

Figure 25:
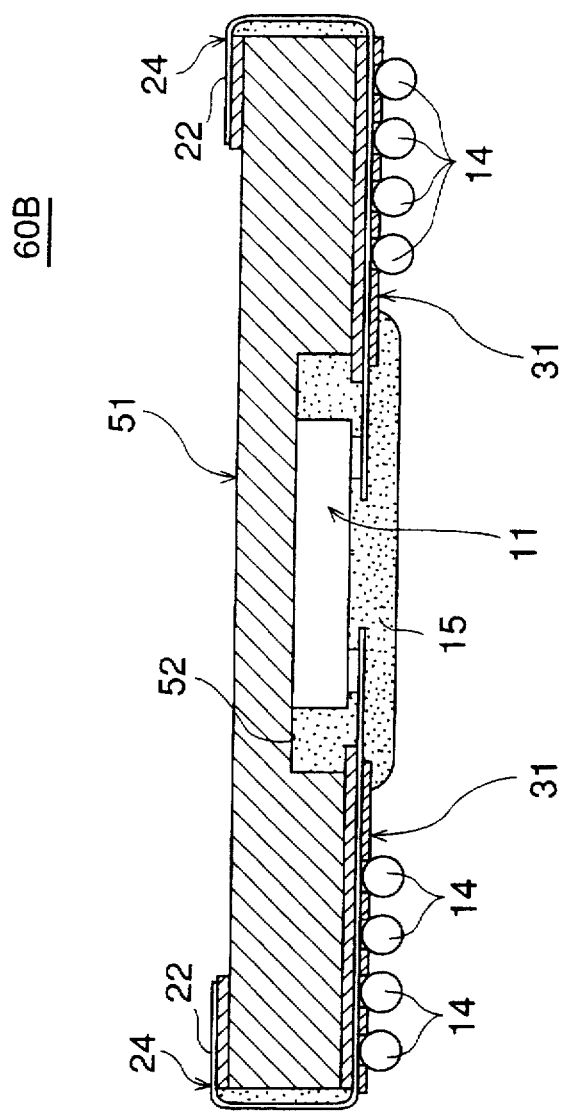
FIG. 25 shows a semiconductor device according to the sixth embodiment of the present invention.

FIG. 25 shows a semiconductor device 60B according to the sixth embodiment of the present invention. In the semiconductor device 60B, the semiconductor element 11 is sealed in the cavity 52 with a sealing resin 15. This embodiment is characterized by a mold formation of the sealing resin 15.

Figure 26:
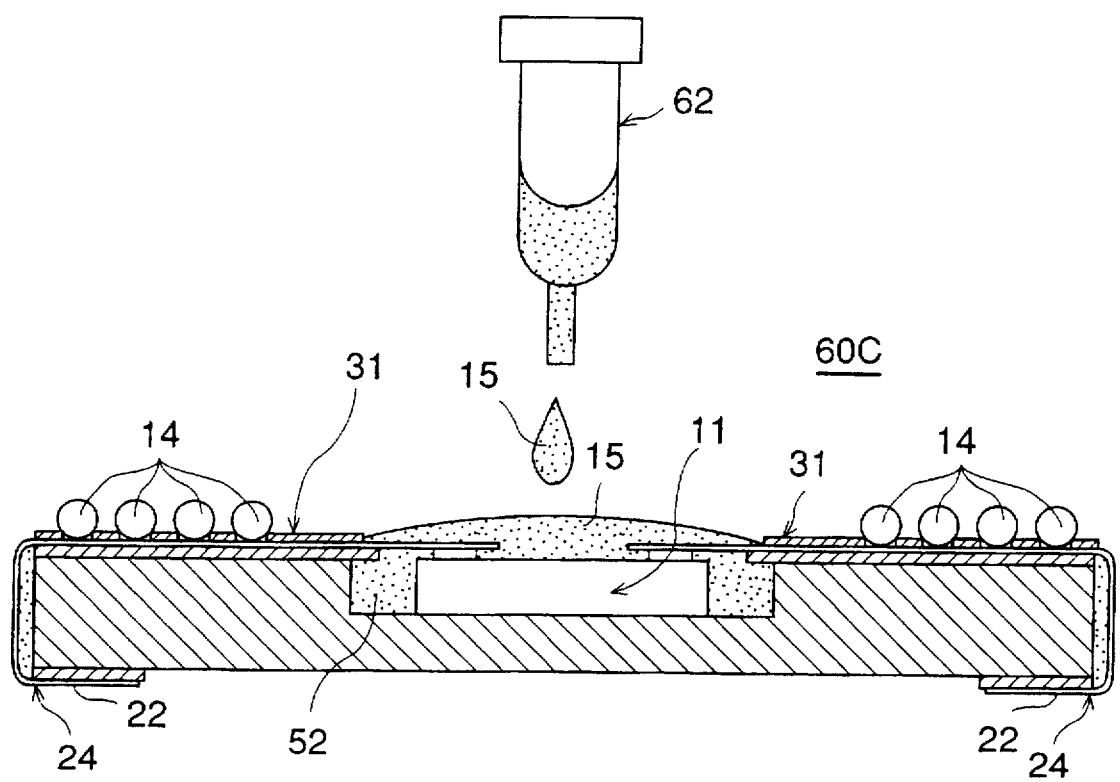
FIG. 26 shows a semiconductor device according to the seventh embodiment of the present invention.

FIG. 26 shows a semiconductor device 60C according to the seventh embodiment of the present invention. In the semiconductor device 60C, the semiconductor element 11 is also sealed in the cavity 52 with a sealing resin 15. This embodiment is characterized by a potting of the sealing resin 15 using a cylinder 62.

According to the semiconductor devices 60B and 60C of the sixth and the seventh embodiment, respectively, of the present invention, since a sealing resin is used for sealing the semiconductor element 11 in the cavity 52, it is possible to perform such sealing of the semiconductor device 11 on a large scale with reduced cost. Especially, since the sealing is made by a molded resin in the semiconductor device 60B of the sixth embodiment, it is possible to carry out the sealing with high accuracy. Moreover, since the sealing is made by a potting of resin, in which the use of a mold is not necessary, in the semiconductor device 60C of the seventh embodiment, it is possible to perform the sealing process at a reduced cost.

Next, an eighth embodiment according to the present invention will be described.

Figure 27:
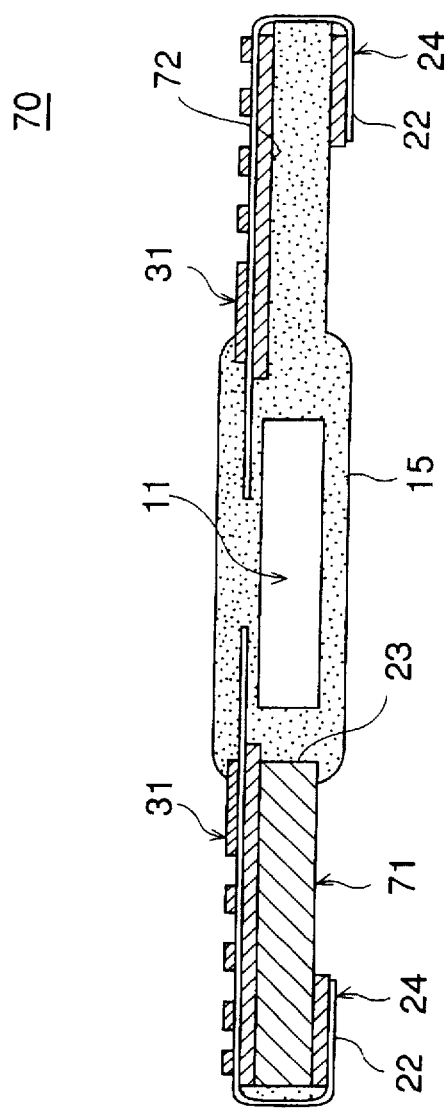
FIG. 27 shows a semiconductor device according to the eighth embodiment of the present invention.

FIG. 27 is a diagram showing a semiconductor device 70 according to the eighth embodiment of the present invention. Note that elements which are the same as the ones in the semiconductor device 30 of the above-mentioned second embodiment (refer to FIGS. 7 to 9) are indicated by the same reference numerals and explanations thereof will be omitted.

The sealing resin 15 used for the semiconductor device 70 of this embodiment is also molded as in the case of the semiconductor device 60 of the sixth embodiment. The semiconductor device 70 is, especially, characterized by vent portion 72, extending in one direction or a plurality of directions, in the supporting member 71 for connecting the cavity 23 to the outside or externally so that the semiconductor element 11 can be sealed by a molded resin. As shown in FIG. 25, the resin 15 is also filled inside of the vent portion 72.

Figure 29A:
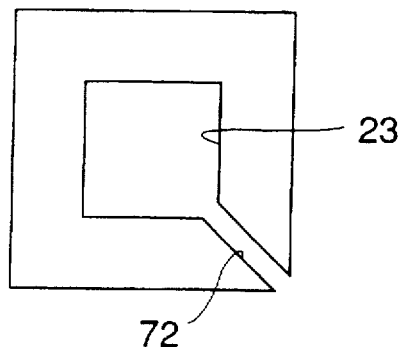
FIG. 29A shows a plan view of a supporting member used in the semiconductor device according to the eighth embodiment of the present invention.
Figure 29B:
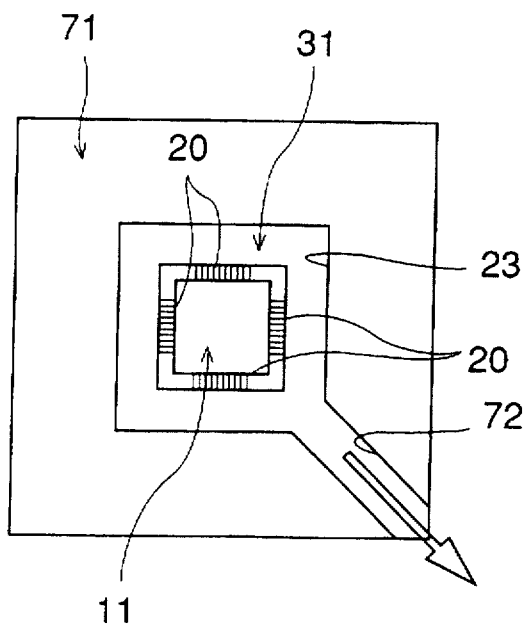
FIG. 29B shows a plan view of the supporting member with which a wiring board is provided.
Figure 30A:
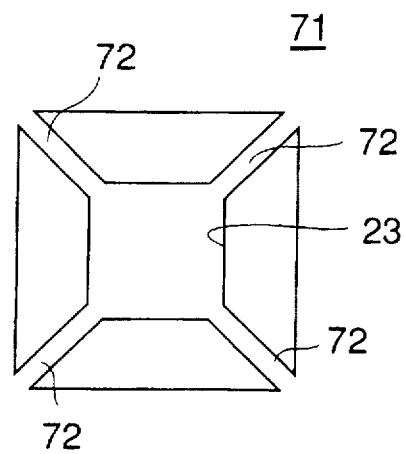
FIG. 30A shows a plan view of a supporting member used in the semiconductor device according to the eighth embodiment of the present invention.

FIGS. 29A, 29B, 30A and 30B show a supporting member 71 used in the semiconductor device 70 according to the eighth embodiment of the present invention. FIGS. 29A and 30A, respectively, shows a plan view of the supporting member 71 and FIGS. 29B and 30B, respectively, shows a plan view of the supporting member 71 with which the wiring board 31 is provided (pad-for-measurement forming region 24 is omitted in the figures).

Figure 30B:
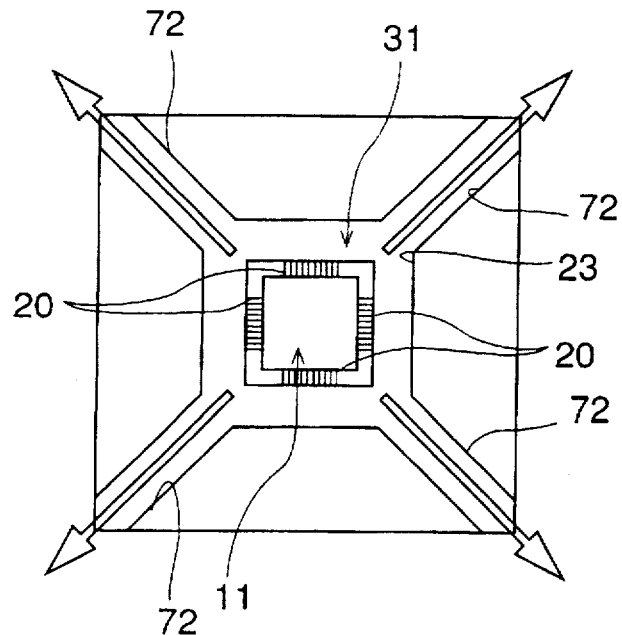
FIG. 30B shows a plan view of the supporting member with which the wiring board is provided.

In FIGS. 29A and 29B, the supporting member 71 in which the vent portion 72 extends in only one direction is shown. In FIGS. 30A and 30B, the supporting member 71 which has the vent portions 72 extending in a plurality of directions (four in the figure) is shown. The structure and the shape of the vent portion 72 according to the present invention is not limited and can be a groove formed on the supporting member. In FIGS. 29 and 30, the vent portion 72 is formed by cutting the supporting member 71.

Figure 28:
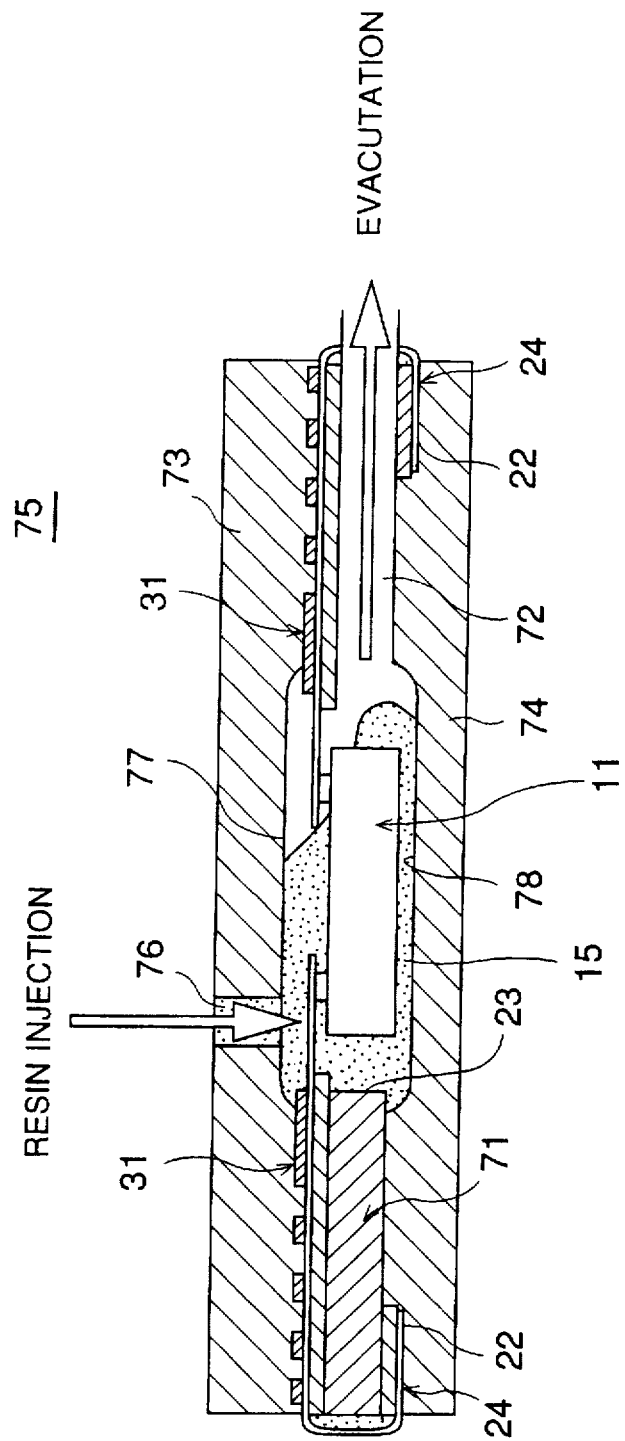
FIG. 28 is a diagram for explaining a resin sealing step for the semiconductor device according to the eighth embodiment of the present invention.

FIG. 28 is a diagram for explaining a resin sealing step during the production of the semiconductor device 70. In the resin sealing step, the supporting member 71 provided with the wiring board 12 is fitted in a mold 75 having an upper portion 73 and a lower portion 74. A gate 76 from which the sealing resin is introduced is provided in the upper portion 73 of the mold 75. There are cavity portions 77 and 78 as shown in the figure which are interspace to be filled with the sealing resin 15.

When the sealing resin 15 is introduced from the gate 76, the cavity portions 77 and 78 and 23 formed in the supporting member 71 are filled with the resin 15. At this time, air existing in these cavities is pushed by the oncoming resin 15 and is evacuated to the outside through the vent portion(s) 72 formed in the supporting member 71.

The direction of the air evacuation is indicated by an arrow in FIGS. 28, 29B and 30B. Since the air in the cavity is evacuated through the vent portion(s) 72 as described above, it is possible to smoothly carry out the resin sealing process.

Also, since the vent portion(s) 72 is formed in the supporting member 71 according to the present invention, it is not necessary to form such portions in, for example, the upper portion 73 or the lower portion 74 of the mold 75. Thus, the structure of the mold 75 can be simplified and the cost necessary for constructing the mold 75 may be decreased.

Next, a ninth embodiment according to the present invention will be described.

Figure 31:
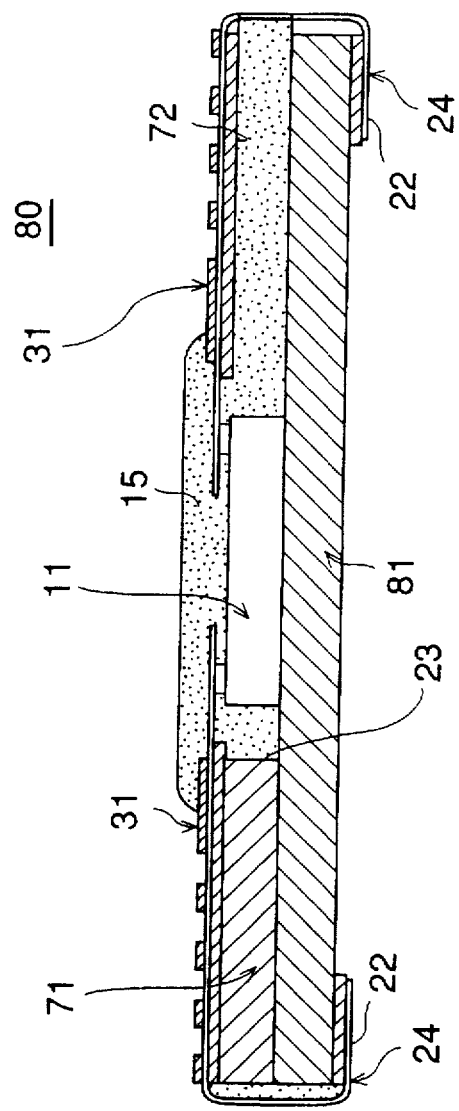
FIG. 31 is a diagram showing a semiconductor device according to the ninth embodiment of the present invention.

FIG. 31 is a diagram showing a semiconductor device 80 according to the ninth embodiment of the present invention. Note that elements which are the same as the ones in the semiconductor device 70 of the above-mentioned eighth embodiment are indicated by the same reference numerals and explanations thereof will be omitted.

The semiconductor device 80 according to this embodiment has vent portion(s) 72 in the supporting member 71, similar to the semiconductor device 70, as well as a heat-releasing plate 81, similar to the semiconductor device 40.

Further, the semiconductor device 80 of this embodiment is characterized by a use of the heat-dissipating plate 81 as a part of a mold used for molding the sealing resin 15. In FIG. 31, the embodiment shows the case where the heat-dissipating plate is used as a lower portion of the mold. Since the heat-dissipating plate 81 is made of a metallic material, as mentioned above, it is possible to use it as a part of the mold.

By using the heat-dissipating plate 81 as a part of the mold, it is possible to omit one of the upper and lower portions of the mold. Thus, the structure of the mold can be simplified and the cost necessary for the mold may be reduced.

Next, a tenth embodiment according to the present invention will be described.

Figure 32:
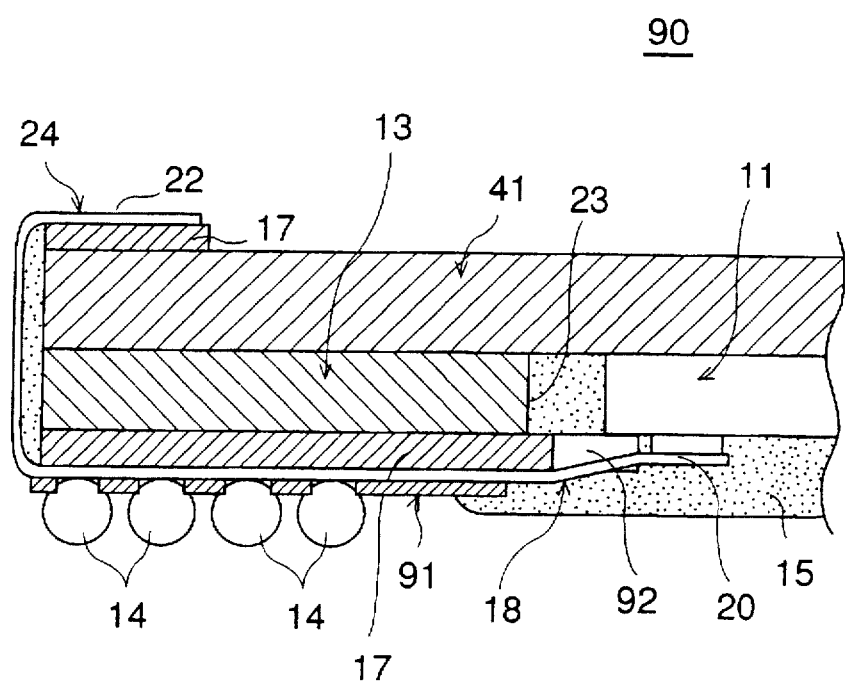
FIG. 32 is a diagram showing a semiconductor device according to the tenth embodiment of the present invention.

FIG. 32 is a diagram showing a semiconductor device 90 according to the tenth embodiment of the present invention. Note that elements which are the same as the ones in the semiconductor device 40 of the above-mentioned third embodiment (refer to FIG. 17) are indicated by the same reference numerals and explanations thereof will be omitted.

Figure 33:
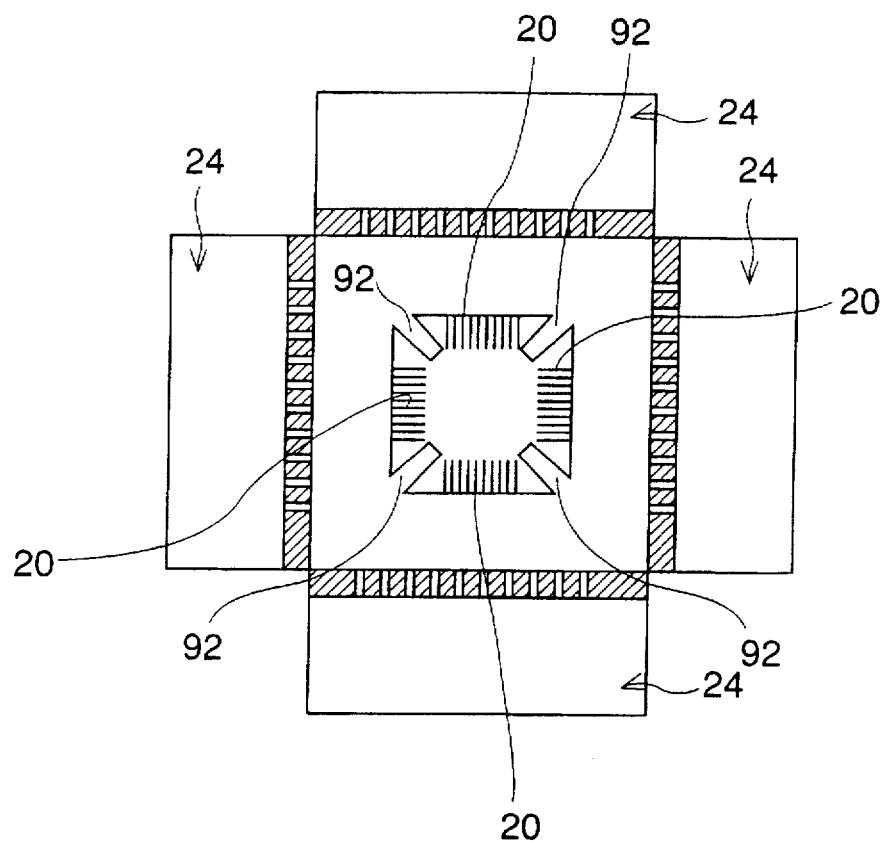
FIG. 33 is a diagram showing a bar-shape holding member for explaining an embodiment of the wiring board used in the semiconductor device according to the tenth embodiment of the present invention.

The semiconductor device 90 according to this embodiment is characterized by having a holding member 92 which supports the semiconductor element 11. The holding member 92 is integrally formed with the base film 17 and extends inside of the cavity 23 as shown in FIG. 33.

Also, when the semiconductor element 11 is flip-chip bonded to the inner lead portion 20, the semiconductor element 11 contacts to an upper portion of the holding member 92 so that the element 11 may be supported by the holding member 92.

As mentioned above, the base film 17 has a predetermined strength as well as the flexible property. Thus, by using a part of the base film 17 as the holding member 92, it is possible to positively support the semiconductor element 11. Moreover, if a part of the base film 17 is used as the holding member 92, it is possible to reduce the number of parts forming a semiconductor device.

According to the semiconductor device 90 having the above-mentioned structure, it is possible to securely mount the semiconductor element 11 on the wiring board 91. Thus, problems such as detachment of the semiconductor element 11 from the wiring board 91 during the sealing procedure can be prevented and, therefore, the reliability and an increase in production of the semiconductor device 90 can be improved.

Figure 34:
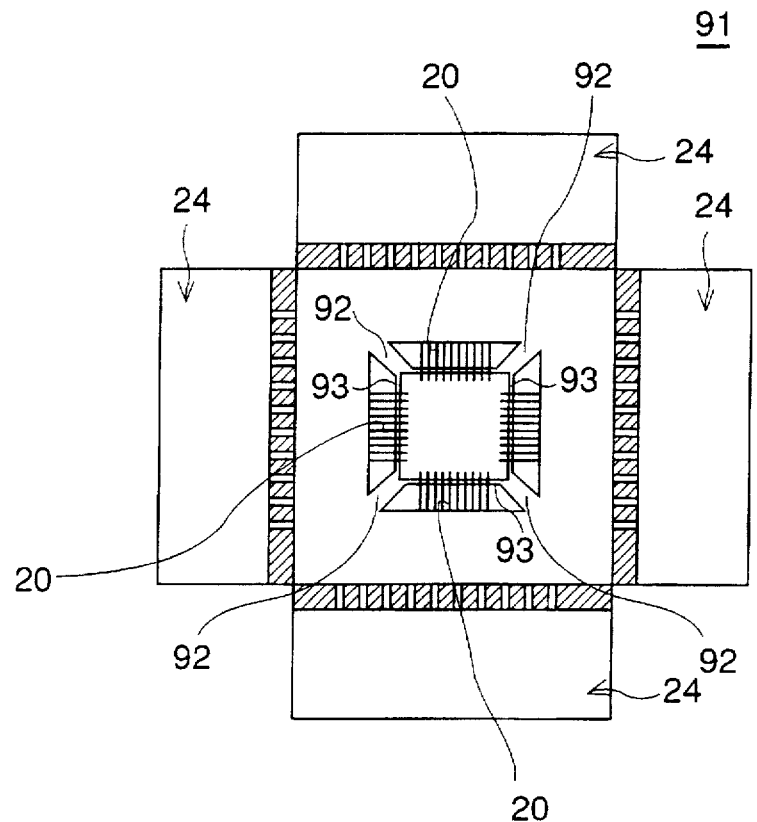
FIG. 34 is a diagram showing a ring-shape holding member for explaining an embodiment of the wiring board used in the semiconductor device according to the tenth embodiment of the present invention.

The shape of the holding member according to the present invention is not limited and can be a bar-shape (92) as shown in FIG. 33 or can be a ring-shape (93) connecting four holding members (93) as shown in FIG. 34. Any shape can be applied to the holding member if it is capable of supporting the semiconductor element 11.

Next, an eleventh embodiment according to the present invention will be described.

Figure 35:
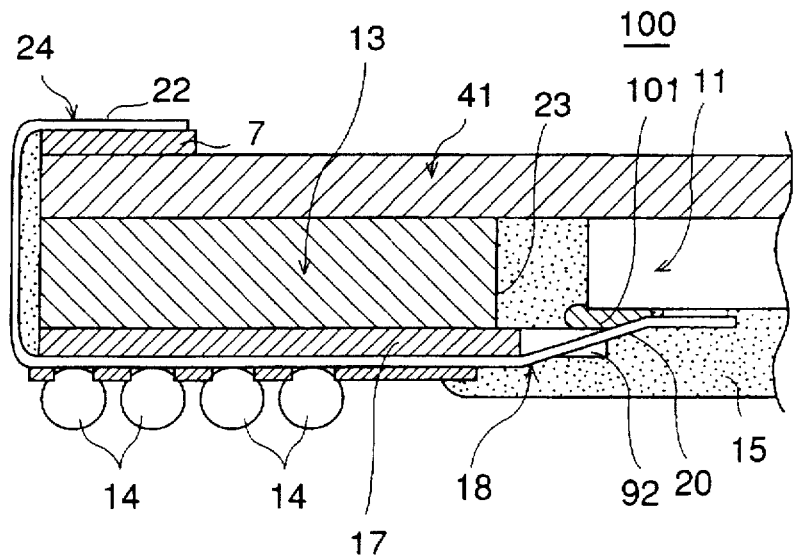
FIG. 35 is a diagram showing a semiconductor device according to the eleventh embodiment of the present invention.

FIG. 35 is a diagram showing a semiconductor device 100 according to the eleventh embodiment of the present invention. Note that elements which are the same as the ones in the semiconductor device 90 of the above-mentioned tenth embodiment (refer to FIG. 32) are indicated by the same reference numerals and explanations thereof will be omitted.

The semiconductor device 100 according to this embodiment is characterized by having an elastic member 101 provided between the holding member 92 and the semiconductor element 11. The elastic member 101 is made of, for example, a rubber material or a resin having an elasticity and is fixed between the holding member 92 and the semiconductor element 11 by an adhesive or the like.

According to the semiconductor device 100 having the above-mentioned structure, if an external force is applied to the device 100, the shock can be absorbed by the elastic member 101. Thus, it is possible to prevent a detachment of the semiconductor element 11 from the lead 18 due to the shock and the reliability of an electrical connection between the semiconductor element 11 and the lead 18 can be increased.

Next, a twelfth embodiment according to the present invention will be described with reference to FIGS. 36A and 36B.

Figures 36A, 36B:
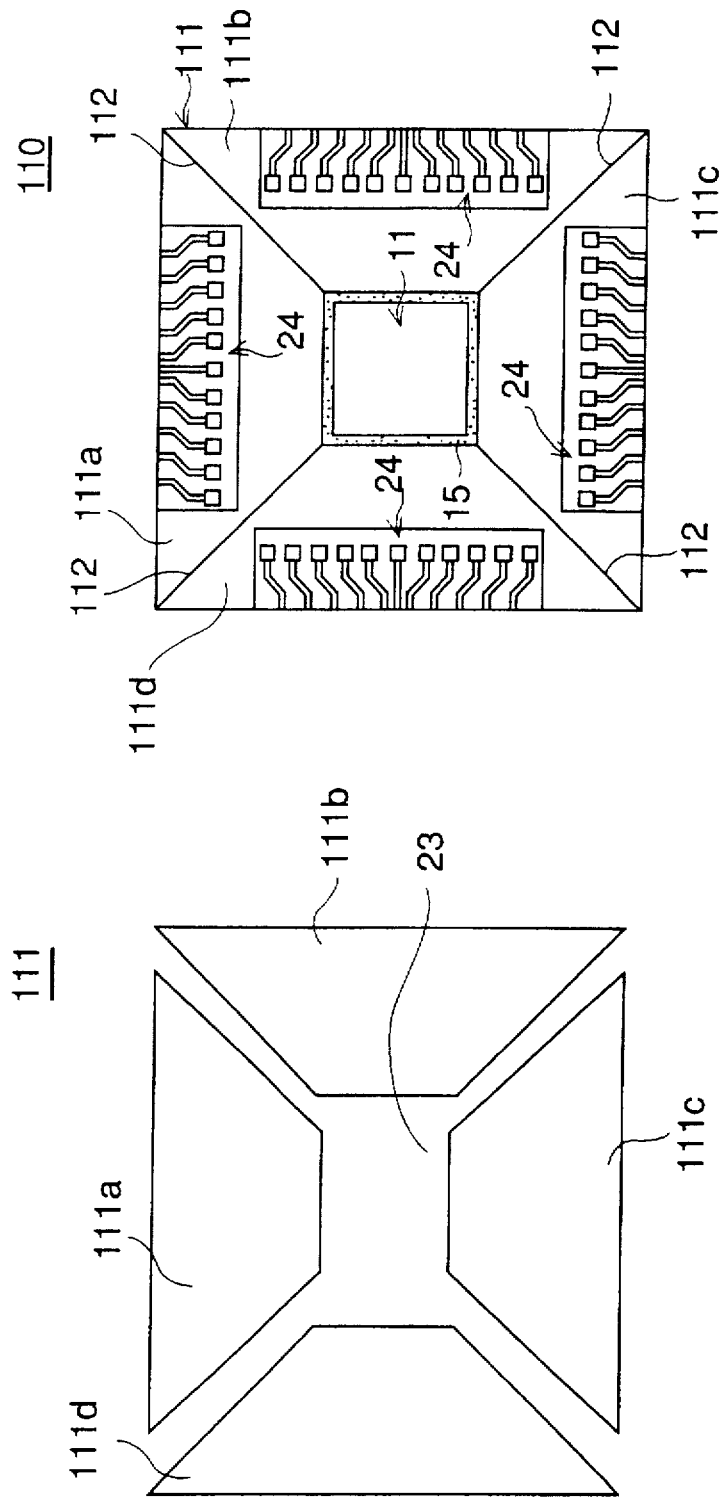
FIG. 36A is a diagram showing a supporting member used for a semiconductor device according to the twelfth embodiment of the present invention.
FIG. 36B is a diagram showing a plan view of the semiconductor device according to the twelfth embodiment of the present invention.

In FIG. 36A, a supporting member 111 used for a semiconductor device 110 according to this embodiment is shown. FIG. 36B is a diagram showing a plan view of the semiconductor device 110 according to this embodiment. Note that elements which are the same as the ones in the semiconductor device 40 of the above-mentioned third embodiment (refer to FIG. 17) are indicated by the same reference numerals and explanations thereof will be omitted.

The semiconductor device 110 according to this embodiment is characterized by a division of a supporting member 111 into a plurality of members (four in this embodiment) to produce a plurality of supporting member portions, 111a to 111d, and a bonding of the supporting member portions 111a to 111d using an elastic member 112 provided between the supporting member portions.

The number of the supporting member portions according to the present invention is not limited to four and an appropriate number can be selected according to, for instance, a thermal expansion coefficient of the material forming the supporting member 111 (to be described later). Also, the elastic member 112 is provided between the supporting member portions 111a to 111d using an adhesive or the like when the portions are bonded.

As mentioned above, the elastic member 112 can be formed of a rubber or a resin having elastic property. Also, it is possible to use an adhesive having elastic property as the elastic member 112 and in this case the number of parts and cost necessary for the semiconductor device can be reduced since the elastic member 112 has an adhesive property as well as the elastic property.

According to the semiconductor device 110 having the above-mentioned structure, if the supporting member portions 111a to 111d are expanded during a heating step during the mounting procedure of the device, the thermal expansion of the portions 111a to 111d can be absorbed by the elastic member 112. Thus, it is possible to prevent generation of a stress at a connecting portion of the semiconductor device 11 and the lead 18 and that of the projecting electrodes 14 and the lead 18.

Figure 37B:
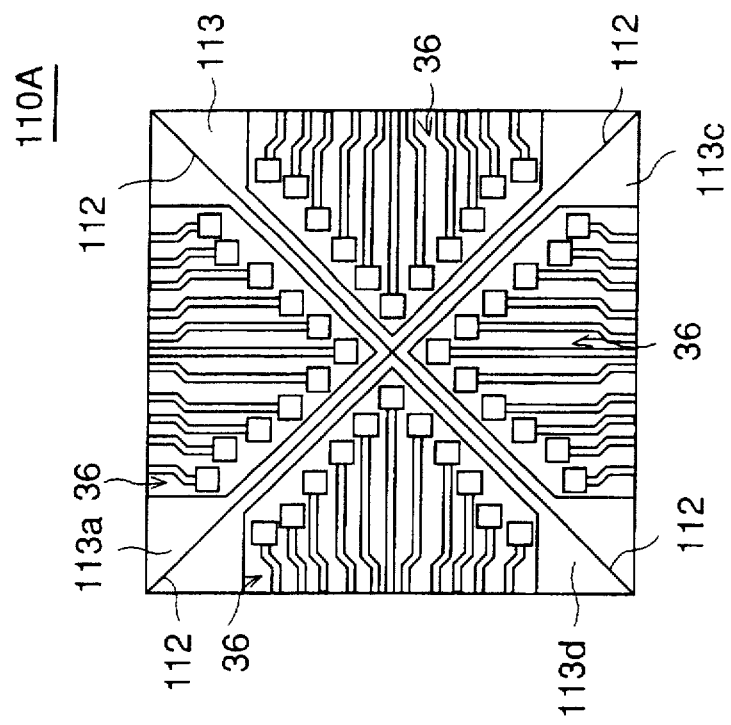
FIG. 37B is a plan view of the semiconductor device using the heat-releasing plate shown in FIG. 37A.
Figure 37A:
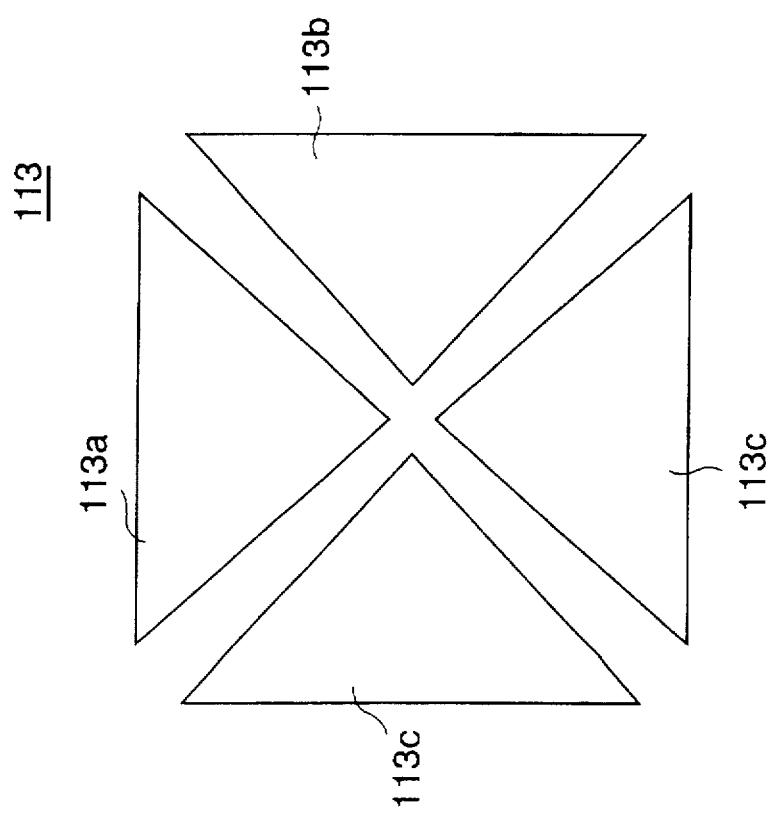
FIG. 37A is a plan view of the heat-releasing plate used in the twelfth embodiment of the present invention.

On the other hand, if a semiconductor device is provided with a heat-releasing plate as in the case of the semiconductor device 40 of the third embodiment, it is possible, as shown in FIG. 37A, to divide the heat-dissipating plate 113 into a plurality of portions (four in this embodiment) to produce heat-dissipating plate portions 113a to 113d and then bond the portions 113a to 113d together using the elastic member 112.

FIG. 37A is a plan view of the heat-releasing plate 113 having the above-mentioned structure and FIG. 37B is a plan view of the semiconductor device 110A using the heat-releasing plate 113. As shown in the figures, thermal expansion of each of the heat-releasing plate portions 113a to 113d generated during a heating step can be absorbed by the elastic member 112 if the heat-releasing plate 113 is formed by a plurality of the heat-releasing plate portions 113a to 113d, each of which is bonded by the elastic member 112. Thus, according to the heat-releasing plate 113 having the above-mentioned structure, it is possible to prevent generation of a stress due to the thermal expansion of the heat-releasing plate 113 at a connecting portion of the semiconductor device 11 and the lead 18 and that of the projecting electrodes 14 and the lead 18.

Next, a thirteenth embodiment according to the present invention will be described with reference to FIG. 38.

Figure 38:
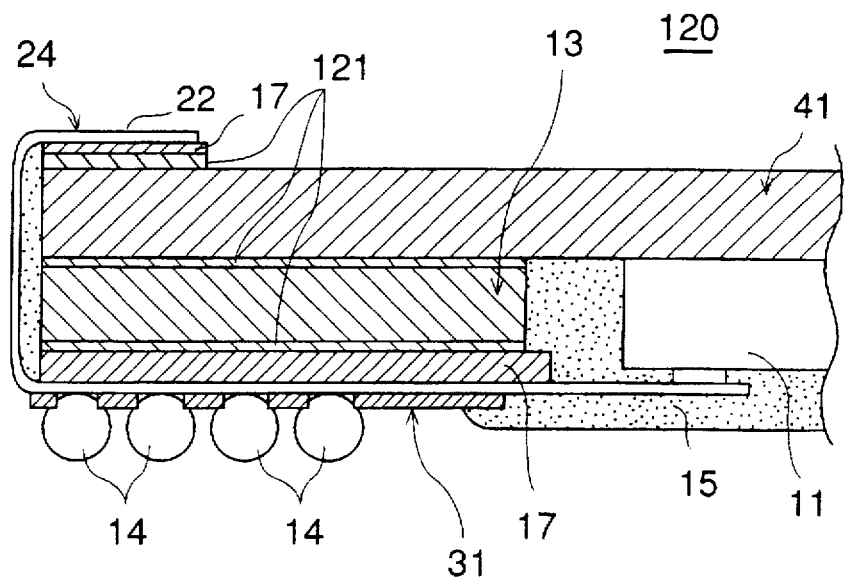
FIG. 38 is a diagram showing a semiconductor device according to the thirteenth embodiment of the present invention.

FIG. 38 is a diagram showing a semiconductor device 120 according to the thirteenth embodiment of the present invention. Note that elements which are the same as the ones in the semiconductor device 40 of the above-mentioned third embodiment (refer to FIG. 17) are indicated by the same reference numerals and explanations thereof will be omitted.

The semiconductor device 120 according to this embodiment is characterized by its structure having an elastic adhesive 121 between the supporting member 13 and the heat-dissipating plate 41, between the supporting member 13 and the wiring board 31 and between the heat-dissipating plate 41 and the wiring board 31.

As mentioned above, the supporting member 13, the heat-dissipating plate 41 and the wiring board 41, respectively, are made of different materials and, therefore, the thermal expansion coefficient of each is also different. Thus, if the supporting member 13, the heat-dissipating plate 41 and the wiring board 31 are directly connected to each other, stress will be generated at the interfaces of the supporting member 13, the heat-dissipating plate 41 and the wiring board 31 due to the difference of the thermal expansion coefficient among them. If the stress generated exceeds a certain threshold value, there is a danger that problems such as peeling of the supporting member 13, the heat-dissipating plate 41 and the wiring board 31 will occur.

However, according to the semiconductor device 120 of this embodiment, since the elastic adhesive 121 is provided as described above, the stress generated will be absorbed by the elastic adhesive 121. Therefore, problems such as peeling of the interface or a generation of cracks can positively be prevented and the reliability of the semiconductor device 120 can be improved.

Next, a fourteenth embodiment according to the present invention will be described with reference to FIG. 39.

Figure 39:
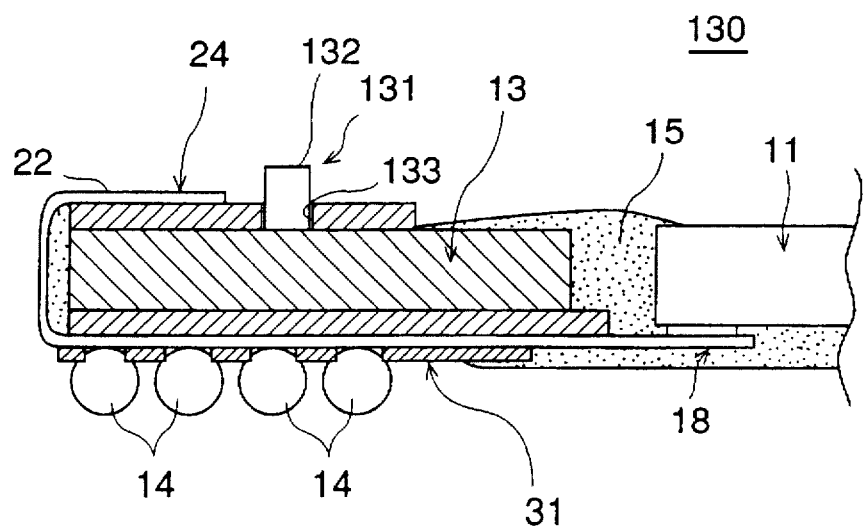
FIG. 39 is a diagram showing a semiconductor device according to the fourteenth embodiment of the present invention.

FIG. 39 is a diagram showing a semiconductor device 130 according to the fourteenth embodiment of the present invention. Note that elements which are the same as the ones in the semiconductor device 30 of the above-mentioned second embodiment (refer to FIGS. 7 to 9) are indicated by the same reference numerals and explanations thereof will be omitted.

The semiconductor device 130 according to this embodiment is characterized by a locating mechanism 131 for positioning the supporting member 13 and the wiring board 31. The locating mechanism 131 is comprised of a locating pin 132 implanted in the supporting member 13 and a locating hole 133.

When the positioning of the supporting member 13 and the wiring board 31 is performed using the locating mechanism 131, the locating pin 132 is inserted in the locating hole 133 during a bending process of the wiring board 31.

Since the position of the locating pin 132 and that of the locating hole 133 are predetermined with high accuracy, the positioning of the supporting member 13 and the wiring board 31 can easily be carried out by simply inserting the locating pin 132 in the locating hole 133. Thus, according to this embodiment, the positioning of the supporting member 13 and the wiring board 31 can be performed by a simple operation with high accuracy.

Figure 40:
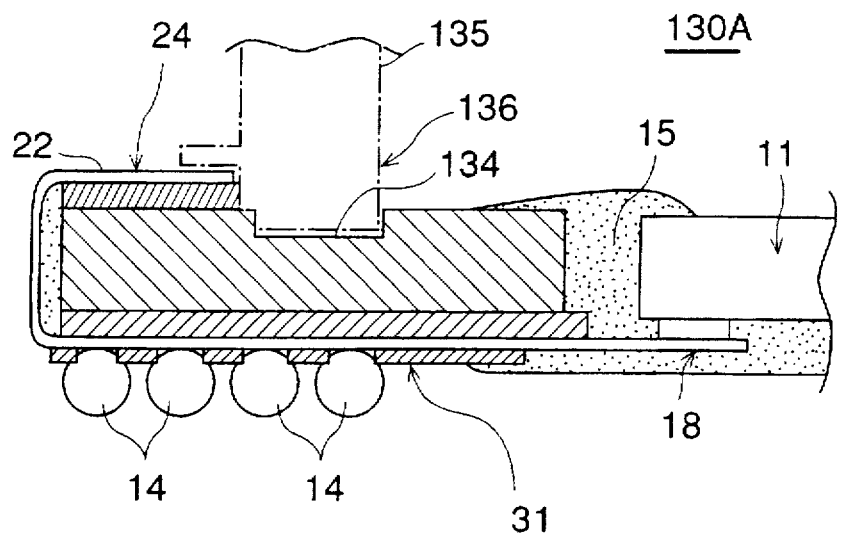
FIG. 40 shows a semiconductor device which is a modified embodiment of the semiconductor device according to the fourteenth embodiment of the present invention.

FIG. 40 shows a semiconductor device 130A which is a modified embodiment of the semiconductor device 130 of the fourteenth embodiment. The semiconductor device 130A is characterized by a locating concave portion 134 for positioning the supporting member 13 and the wiring board 31 provided in the upper portion of the supporting member 13.

A positioning member 135 indicated by the dotted line in FIG. 40 is inserted in the locating concave portion 134. In this embodiment, a locating mechanism 136 is comprised of the locating concave portion 134 and the positioning member 135. The positioning of the supporting member 13 and the wiring board 31 is carried out by adhering the wiring board 31 to the supporting member 13 while maintaining the state in which an end of the pad-for-measurement forming region 24 is contacted to the positioning member 135.

Figure 41:
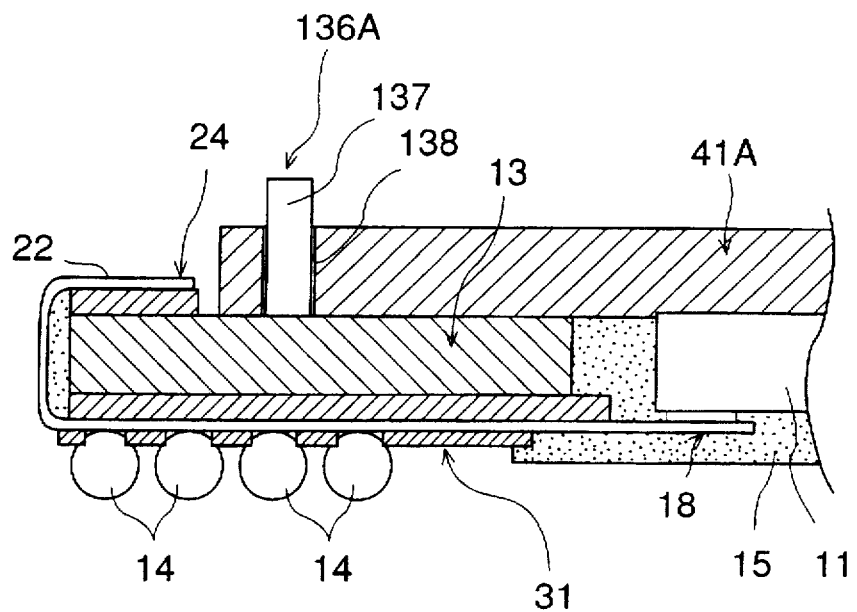
FIG. 41 shows a semiconductor device which is another modified embodiment of the semiconductor device according to the fourteenth embodiment of the present invention.

FIG. 41 shows a semiconductor device 130B which is another modified embodiment of the semiconductor device 130 of the fourteenth embodiment. Note that elements which are the same as the ones in the semiconductor device 40A shown in FIG. 22 are indicated by the same reference numerals and explanations thereof will be omitted.

The semiconductor device 130B according to this embodiment is characterized by a locating mechanism 136A for positioning the supporting member 13 and a heat-releasing plate 41A. The locating mechanism 136A is comprised of a locating pin 137 implanted in the supporting member 13 and a locating hole 138 formed in the heat-dissipating plate 41A.

Since the position of the locating pin 137 and that of the locating hole 138 are predetermined with high accuracy, the positioning of the supporting member 13 and the heat-dissipating plate 41A can easily be carried out by simply inserting the locating pin 137 in the locating hole 138.

Next, a fifteenth embodiment according to the present invention will be described with reference to FIGS. 42 and 43.

Figure 42:
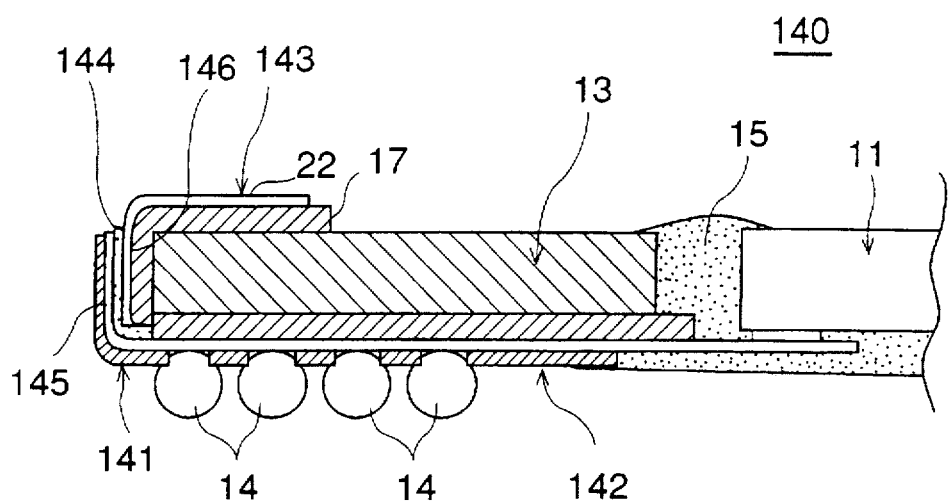
FIG. 42 is a diagram showing a cross-sectional view of a semiconductor device according to the fifteenth embodiment of the present invention.

FIG. 42 is a diagram showing a cross-sectional view of a semiconductor device 140 according to the fifteenth embodiment of the present invention. FIG. 43 is a diagram showing an exploded view of the semiconductor device 140. Note that elements which are the same as the ones in the semiconductor device 30 of the above-mentioned second embodiment (refer to FIGS. 7 to 9) are indicated by the same reference numerals and explanations thereof will be omitted.

The semiconductor device 140 according to this embodiment is characterized by its structure in which a wiring board 140 is divided into a main body 142 and a pad-for-measurement forming region 143, wherein the main body 142 and the pad-for-measurement forming region 143 are electrically connected by a connecting member 144.

Figure 44A:
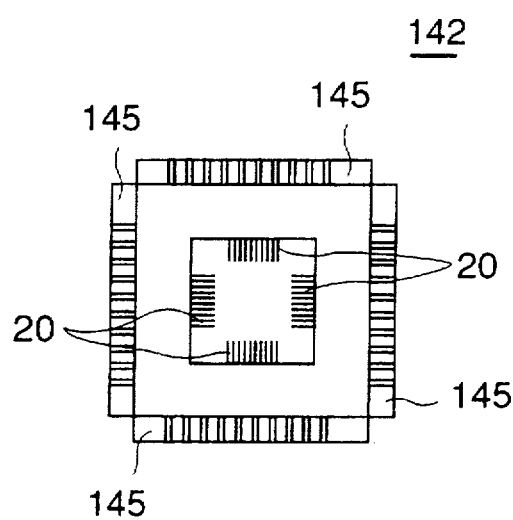
FIG. 44A is a diagram showing a plan view of a main body of a wiring board used in the semiconductor device according to the fifteenth embodiment of the present invention.
Figure 44B:
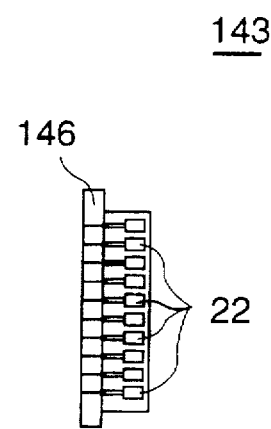
FIG. 44B shows a plan view of the pad-for-measurement forming region of the wiring board shown in FIG. 44A.

The main body 142 is formed underneath the supporting member 13 and the semiconductor element 11 and the projecting electrodes 14 are connected. The pad-for-measurement forming region 143 is formed on the upper surface 13a of the supporting member 13. The structure of the wiring board 141 is the same as that of the wiring board 31 shown in FIGS. 7 to 10 except that the wiring board 140 is divided into the main body 142 and the pad-for-measurement forming region 143 and connecting portions 145 and 146 connected by the connecting member 144 are provided. Note that FIG. 44A is a diagram showing a plan view of the main body 142 and FIG. 44B shows a plan view of the pad-for-measurement forming region 143.

Now, the structure related to an electrical connection of the main body 142 with the pad-for-measurement forming region 143 according to this embodiment will be explained. In order to make an electrical connection between the main body 142 and the pad-for-measurement forming region 143, the main body 142 is fixed to the lower portion of the supporting member 13 and the pad-for-measurement forming region 143 is fixed to the upper surface 13a of the supporting member 13.

Figure 43:
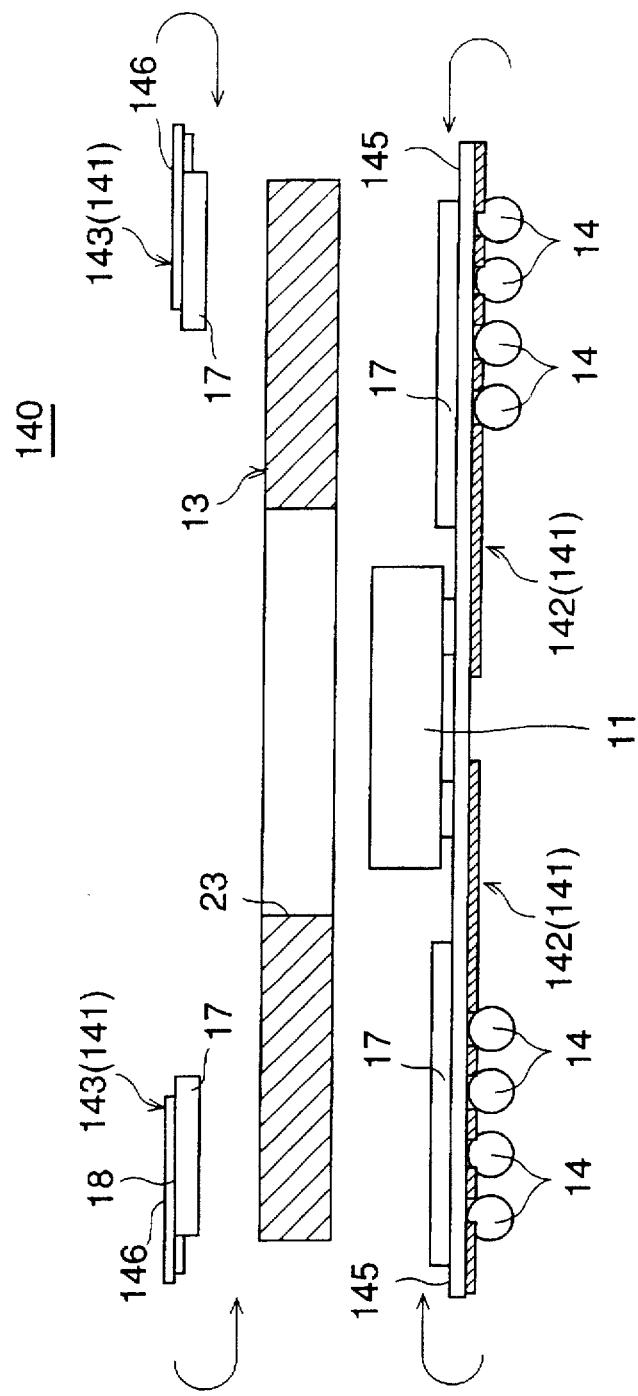
FIG. 43 is a diagram showing an exploded view of the semiconductor device according to the fifteenth embodiment of the present invention.

Then, the connecting portion 145 formed adjacent to the main body 142 and the connecting portion 145 formed in the pad-for-measurement forming region 143 are bent, respectively, as indicated by arrows in FIG. 43. The bending process is carried out so that the connecting member 144 is inserted between the connecting portion 145 and 146.

The connecting member 144 is, for instance, an anisotropic-electroconductive adhesive in which electroconductive metal powder is mixed with an adhesive resin and when the connecting member 144 is pressed, an electroconductivity is generated only in the pressed direction. Therefore, an electrical connection between the main body 142 and the pad-for-measurement forming region 143 can be realized by inserting the connecting member 144 between the connecting portion 145 and 146 and performing the bending process followed by a pressing process.

Also, since the forming position of the leads 18 of the main body 142 and the pad-for-measurement forming region 143 is thicker than the base film 17, a stronger pressing force is applied to the leads 18 during the pressing process. Thus, the electro-conductance of the portion where only the base film 17 is provided does not occur and, therefore, problems such as a shortening of adjacent leads 18 are avoided.

It is one of the advantages of this embodiment that the main body 142 and the pad-for-measurement forming region 143 can be separately formed since they can be connected by use of the connecting member 144. Therefore, the size of each part can be reduced and a dead space present in the semiconductor device can also be decreased.

In addition, although projecting electrodes 14 which are made of solder bumps are used in the above-mentioned embodiments, the present invention is not limited by those and the bumps can be made of other materials or the electrodes can be made by, for example, metal plating.

Figure 45:
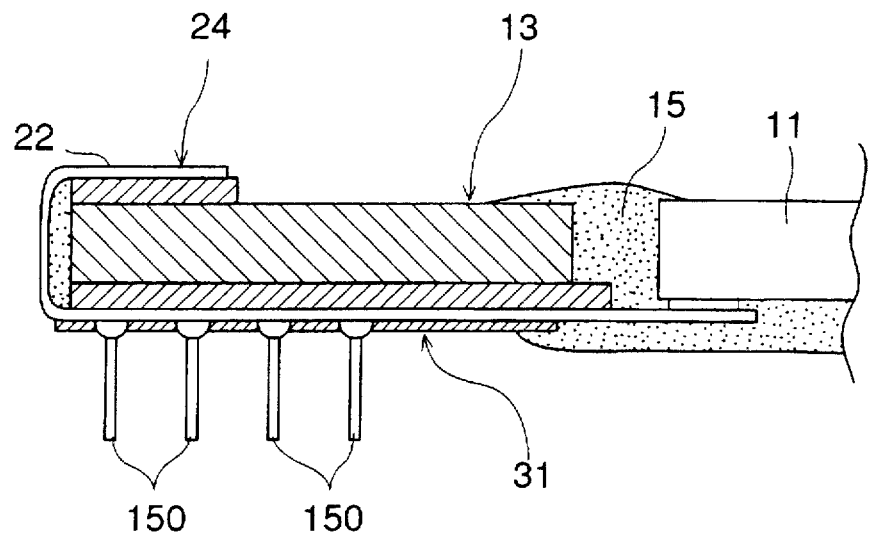
FIG. 45 is a diagram showing pillar shaped metal terminals used as projecting electrodes.
Figure 46:
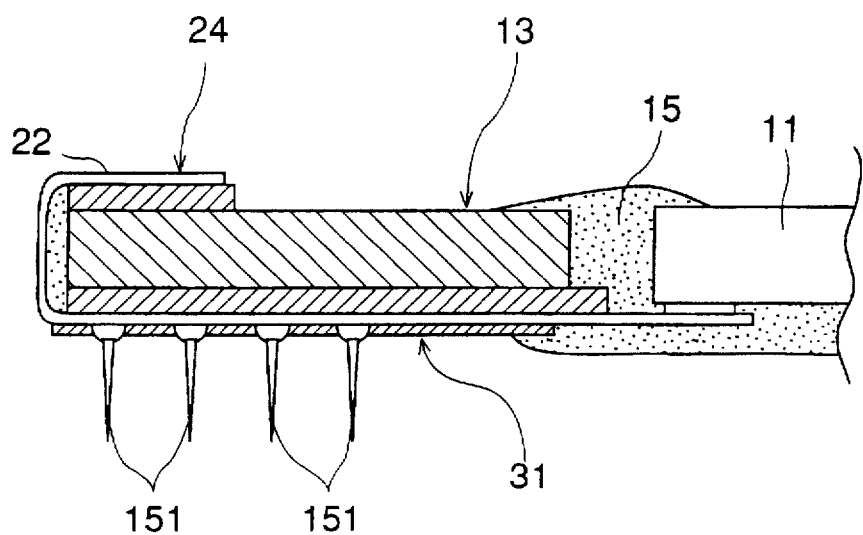
FIG. 46 is a diagram showing needle shaped metal terminals used as projecting electrodes.
Figure 47:
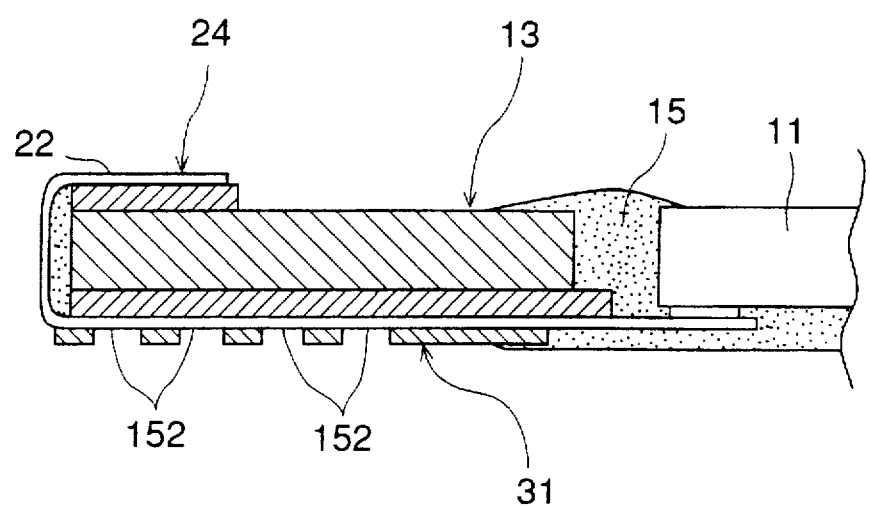
FIG. 47 is a diagram showing flat-shape metal terminals used as projecting electrodes.

Moreover, the shape of the projecting electrodes is not limited and, for example, ones shown in FIGS. 45 to 47 can also be used. In FIG. 45, pillar shaped metal terminals 150 are used as the projecting electrodes and needle shaped metal terminals 151 are shown in FIG. 46. In FIG. 47, flat-shape metal terminals 152 are shown. Note that elements which are the same as the ones in the semiconductor device 30 of the above-mentioned second embodiment (refer to FIGS. 7 to 9) are indicated by the same reference numerals. Since each of these terminals 150, 151 and 152 can easily be produced using known methods, the production cost will be inexpensive. Also, the shape of the electrodes can appropriately be chosen according to a terminal structure of the mounting board. Thus, application of the present invention can be widened.

Further, it is obvious that the present invention is not limited to the above-mentioned embodiments, and variations and modifications may be made without departing from the scope of the present invention.

What is claimed is:

1. A semiconductor device comprising:

a semiconductor element;

a wiring board including a base film on which a plurality of leads are provided;

projecting electrodes, provided in an array, projecting from a lower surface of said wiring board;

a plurality of leads, each of which has an inner lead portion connected to said semiconductor element and an outer lead portion connected to said projecting electrodes;

a mounting hole provided in said base film for mounting said semiconductor element;

a supporting member supporting said wiring board and having a cavity for accommodating said semiconductor element in a position corresponding to said mounting hole; and a pad portion for measurement including a plurality of conductive pads connected to said plurality of leads, said plurality of conductive pads exposed to an exterior of said semiconductor device to thereby allow testing of said semiconductor device.

2. A semiconductor device comprising:

a semiconductor element;

a wiring board including a base film on which a plurality of leads are provided;

projecting electrodes, provided in an array, projecting from a lower surface of said wiring board;

a plurality of leads, each of which has an inner lead portion connected to said semiconductor element and an outer lead portion connected to said projecting electrodes;

a mounting hole provided in said base film for mounting said semiconductor element; and a supporting member supporting said wiring board and having a cavity for accommodating said semiconductor element in a position corresponding to said mounting hole, wherein said wiring board being bent along said supporting member and a pad portion for measurement provided on a surface of said supporting member.

3. The semiconductor device as claimed in claim 2, wherein said surface of said supporting member is an upper surface.

4. The semiconductor device as claimed in claim 2, wherein said surface of said supporting member is a side surface.

5. The semiconductor device as claimed in claim 2, wherein said surface of said supporting member is a lower surface.

6. The semiconductor device as claimed in claim 2, wherein a guiding concave portion for guiding a bending position of said wiring board is provided with said supporting member.

7. The semiconductor device as claimed in either claim 1 or 2, further provided with a heat-dissipating plate thermally connected to said semiconductor element.

8. The semiconductor device as claimed in claim 6, further provided with a heat-dissipating plate thermally connected to said semiconductor element.

9. The semiconductor device as claimed in either claim 1 or 2, wherein said supporting member is made of a thermally conductive material and is thermally connected to said semiconductor element.

10. The semiconductor device as claimed in either claim 1 or 2, wherein said semiconductor element is sealed airtight in said cavity.

11. The semiconductor device as claimed in either claim 1 or 2, wherein said semiconductor element is sealed in said cavity by a resin.

12. The semiconductor device as claimed in claim 11, further comprising a vent portion extending in at least one direction to connect said cavity externally is formed in said supporting member so as to enable sealing of said semiconductor element by resin.

13. The semiconductor device as claimed in claim 7, wherein said semiconductor element is sealed in said cavity by a resin using said heat-dissipating plate as a part of a mold.

14. The semiconductor device as claimed in claim 8, wherein said semiconductor element is sealed in said cavity by a resin using said heat-dissipating plate as a part of a mold.

15. The semiconductor device as claimed in either claim 1 or 2, wherein a holding member supporting said semiconductor element is provided in said wiring board.

16. The semiconductor device as claimed in claim 15, further provided with an elastic member located between said holding member and said semiconductor element.

17. The semiconductor device as claimed in claim 2, further comprising a plurality of pad-for-measurement forming regions on which pad portions for measurement are formed in said wiring board and each of said pad-for-measurement forming regions has at least one inclining side.

18. The semiconductor device as claimed in claim 2, wherein said wiring board comprises:
- a main body to which said semiconductor element and said projecting electrodes are provided;
- a plurality of pad-for-measurement forming regions in which the pad portions for measurement are formed; and
- a connecting member electrically connecting said main body with said pad-for-measurement forming regions.

19. The semiconductor device as claimed in either claim 1 or 2, wherein said supporting member is divided into a plurality of supporting member portions and said plurality of supporting member portions are combined by an elastic member provided between said supporting member portions.

20. The semiconductor device as claimed in either claim 1 or 2, wherein said projecting electrodes are shaped as one of ball-shape, pillar shape, needle shape and flat shape.

21. A semiconductor device comprising:
- a semiconductor element;
- a wiring board including a base film on which said semiconductor and a plurality of leads are provided;
- projecting electrodes, provided in an array, projecting from a lower surface of said wiring board;
- a plurality of leads, each of which has an inner lead portion connected to said semiconductor element and an outer lead portion connected to said projecting electrodes;
- a supporting member supporting said wiring board and having a cavity for accommodating said semiconductor element; and
- a pad portion for measurement including a plurality of conductive pads connected to said plurality of leads, said plurality of conductive pads exposed to an exterior of said semiconductor device to thereby allow testing of said semiconductor device.

* * * * *